(12) United States Patent
Demler

(10) Patent No.: US 6,813,597 B1
(45) Date of Patent: Nov. 2, 2004

(54) MIXED SIGNAL SYNTHESIS

(75) Inventor: Michael J. Demler, Scotts Valley, CA (US)

(73) Assignee: Cadence Design Systems, Inc., San Jose, CA (US)

(*) Notice: Subject to any disclaimer, the term of this patent is extended or adjusted under 35 U.S.C. 154(b) by 358 days.

(21) Appl. No.: 09/589,966

(22) Filed: Jun. 8, 2000

Related U.S. Application Data

(60) Provisional application No. 60/140,108, filed on Jun. 18, 1999.

(51) Int. Cl.[7] .............................................. G06F 17/50
(52) U.S. Cl. .............................. 703/14; 703/18; 716/2; 716/18
(58) Field of Search ............................. 703/14, 17, 20, 703/19, 22; 716/2, 18, 4

(56) References Cited

U.S. PATENT DOCUMENTS

| | | | |
|---|---|---|---|
| 4,791,593 A | * 12/1988 | Hennion | 364/578 |
| 5,345,409 A | 9/1994 | McGrath et al. | 364/736 |
| 5,404,319 A | 4/1995 | Smith et al. | 364/578 |
| 5,535,223 A | * 7/1996 | Horstmann et al. | 371/27 |
| 5,655,109 A | * 8/1997 | Hamid | 395/500 |
| 5,659,312 A | 8/1997 | Sunter et al. | 341/120 |
| 5,714,902 A | 2/1998 | Comer | 327/346 |
| 5,838,947 A | * 11/1998 | Sarin | 395/500 |
| 5,946,482 A | * 8/1999 | Barford et al. | 395/500.35 |
| 6,308,300 B1 | * 10/2001 | Bushnell et al. | 716/4 |
| 6,356,796 B1 | * 3/2002 | Spruiell et al. | 700/97 |
| 6,381,564 B1 | * 4/2002 | Davis et al. | 703/22 |
| 6,499,129 B1 | * 12/2002 | Srinivasan et al. | 716/4 |
| 6,637,018 B1 | * 10/2003 | Demler | 716/18 |

OTHER PUBLICATIONS

Antao, B.A.A. and Brodersen, A.J., "ARCHGEN: Automated Synthesis of Analog Systems," *IEEE Transactions on Very Large Scale Integration (VLSI) Systems*, vol. 3, No. 2, Jun. 1995, pp. 231–244.

Antao, B.A.A. and Brodersen, A.J., "Behavioral Stimulation for Analog System Design Verification," *IEEE Transactions on Very Large Scale Integration (VLSI) Systems*, vol. 3, No. 3, Sep. 1995, pp. 417–429.

Antrim Design Systems, Inc., "The Characterization and Behavioral Model Generation of Analog Intellectual Property," *Antrim Design Systems White Paper*, May 1998, pp. 1–8, www.antrim.com.

Borchers, C., Symbolic Behavioral Model Generation of Nonlinear Analog Circuits, *IEEE Transactions on Circuits and Systems—II: Analog and Digital Signal Processing*, vol. 45, No. 10, Oct. 1998, pp. 1362–1371.

Smith, J.T. and Brown, H.K., "Mixed–Signal Circuit Simulation System with Behavioral Modeling Capability," *IEEE Conference Rocord of Southcon/94*, Mar. 1994, pp. 580–583.

* cited by examiner

*Primary Examiner*—Thai Phan
(74) *Attorney, Agent, or Firm*—Fliesler Meyer, LLP

(57) ABSTRACT

Method and apparatus for the synthesis of electronic circuits and, more particuarly, to the synthesis of analog circuitry and mixed digital and analog circuitry, and related to the reuse of circuit designer knowledge for the simulation of mixed analog and digital circuitry to determine data points and to curve fit the data points to determine a polynomial equation that closely approximates simulated circuit performance, and related to the parameterization of circuit features with respect to circuit performance.

23 Claims, 22 Drawing Sheets

Antrim-MSS Architecture

Major Components of Antrim-MSS
Synthesis Library

- Simulation models in Verilog-A/MS
  - represent library functions, parameterized to user's performance specifications
- Characteristic functions of design parameters
  - model circuit performance behavior during optimization
- Test harnesses and charaterization plans
  - developed with Antrim-ACT
- Netlists of mixed-signal functions
  - working circuits, parameterized for sizing to achieve user's performance specifications
- Process technology files - models and design rules
- Synthesizable layout cells

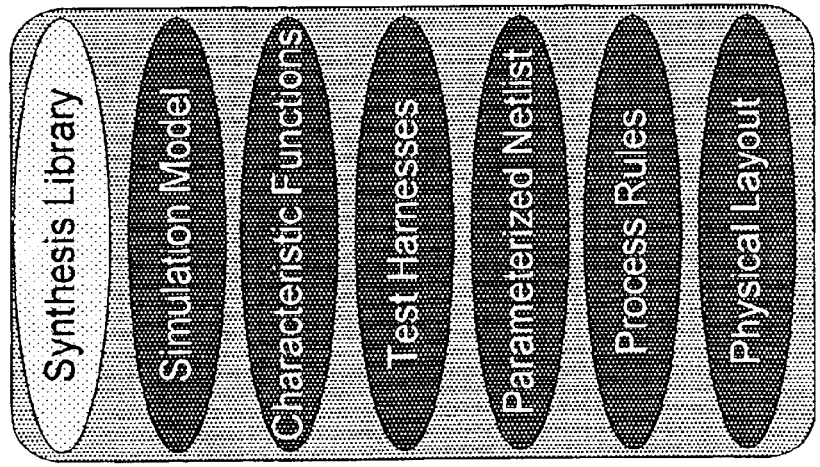

FIG. - 1C

Major Components of Antrin-MSS
Synthesis Toolset

- Antrim-MSS Command Interpreter
  - extensions to Perl scripting language for synthesis plan execution
- Optimizers
  - toolkit of algorithms for sizing of design parameters
- Antrim-AMS
  - for simulation of characteristic functions, behavioral models and sized netlist
- Antrim-ACT
  - for development of characteristic functions, analytical models, test harnesses, circuit characterization
- Parasitic calculators
  - layout parasitic estimation from process rules and sized netlist
- Layout generators

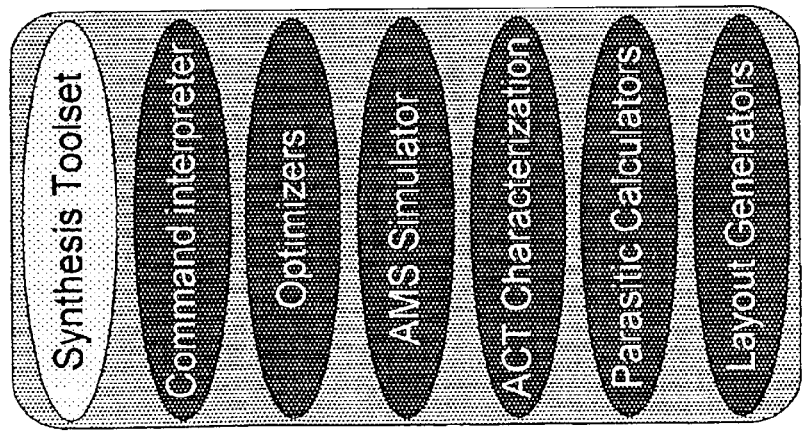

FIG. - 1D

Major Components of Antrin-MSS
Synthesis Plans

- Blueprints for the sucessful synthesis of mixed-signal IP
  - Developed by expert mixed-signal IC designers using MSS and ACT plan development tools
- Programmed series of steps for circuit partitionIng, model selection, sizing and optimization
- Specifications of design parameters to be used as optimization variables
- Specifications of performance characteristics to be used as optimization goals
- Steps for process retargeting
- Antrim-ACT characterization plan
    - Experiments
    - Test harnesses
    - Stimuli and other controls

FIG. - 1E

Plan Author
*Design Flow*

- Design Partitioning
- Characterization
- Model Development
  - circuit
  - behavioral
  - analytic
- Setup Performance Parameters
  - measurements
  - test harnesses
- Set Design Parameters
- Define Optimization Steps

FIG. - 1F

Plan User
*Design Flow*

- Select Function
- Specify Process
- Performance Specification
- Execute Plan
- Verification of Results

FIG. - 1G

Development of a Synthesizable VCO

- Circuit features:
  - Three cells: bias generator, differential delay cell, level restore
  - Eight delay stages for 100 MHz - 200 MHz operation
- Performance parameters:
  - power
  - center frequency
- Optimization plan:
  - size delay cell and bias circuit to achieve user's specifications

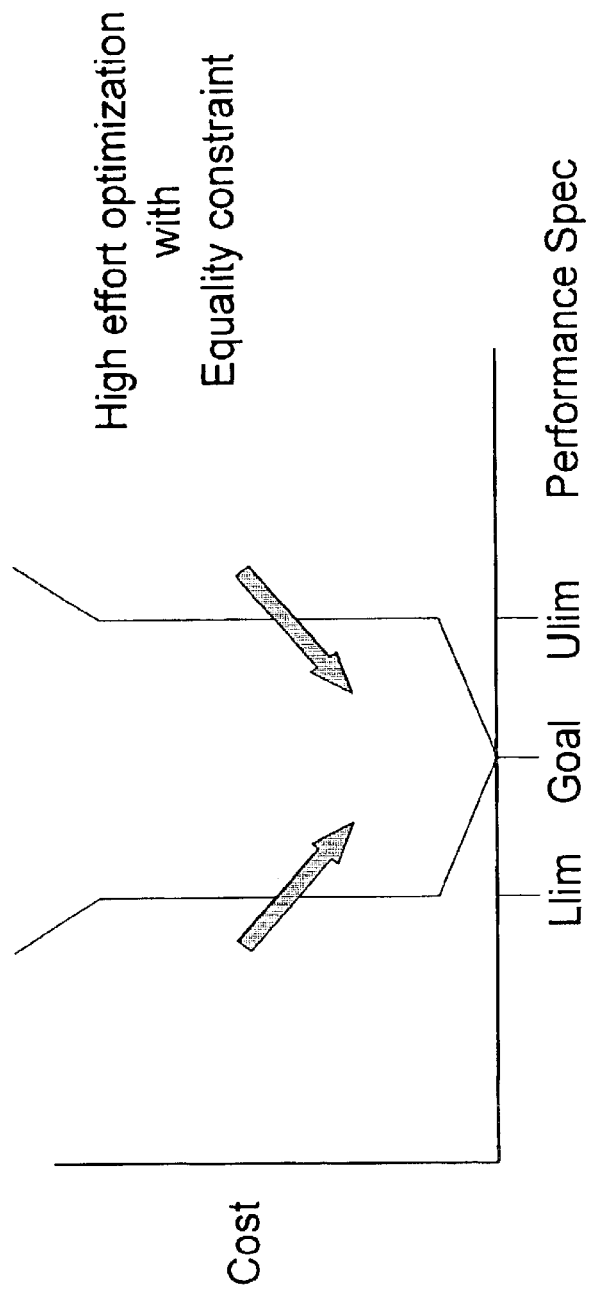

Example: Synthesis Plan for a VCO

Step One

- Size bias transistor for power specification

- 1st step - budget power according to user specification
  $P_{tot} = P_{bias} + 8 * P_{delay}$

- NMOS transistor must remain in triode region with $V_{ds} = V_{diode}$

- Minimize $W_{bias}$ & $L_{bias}$ to meet spec

Example: Synthesis Plan for a VCO
Step One

- Mirror NMOS transistors from bias cell

- Size delay cell transistors for frequency spec

- Use behavioral model of $F_0$ vs. $W_{diff}$, $L_{diff}$

- Minimize diff. pair for input load in ring oscillator

- Set $L_{diff}$ to $L_{min}$

- Optimize $W_{diff}$

Example: Synthesis Plan for a VCO

Step One

- Size bias transistor for power specification
- Measure current with condition $V_{ds} = V_{diode}$
- Minimize $W_{bias}$ & $L_{bias}$ to meet spec
- Analysis Setup:
  - simulate nbias_ivdc.v
    - test harness for bias current sizing
  - analysis = bias.tst
    - measurement experiment for current

Synthesis Plan for a VCO
Finish Steps

- Size noncritical MOSFETs in current sources
  - doesn't require optimization
- Synthesize level translator
- Verify complete design
- Could add other performance specifications
  - gain
  - $F_{min}$
  - $F_{max}$

FIG. - 13

MIXED SIGNAL SYNTHESIS

This application claims priority to Provisional Application No. 60/140,108, filed Jun. 18, 1999, as set forth more fully in this application.

FIELD OF THE INVENTION

This invention relates to synthesis of electronic circuits. The invention is also related to the reuse of circuit designer knowledge. The invention is more particularly related to the synthesis of analog circuitry, and of mixed digital and analog circuitry. The invention is yet further related to the simulation of mixed analog and digital circuitry to determine data points and to curve fit the data points to determine a polynomial equation that closely approximates simulated circuit performance. The invention is still further related to the parameterization of circuit features with respect to circuit performance.

BACKGROUND OF THE INVENTION

The field of circuit simulations has many design languages, simulators, and design programs available to circuit design engineers. One commonly utilized design language is the Verilog® (a registered trademark of Cadence Design Systems, Inc.).

Verilog® is a hardware description language that provides a means of specifying a digital system at a wide range of abstraction levels. The language supports the early conceptual stages of design with its structural level of abstraction. The language provides hierarchical constructs, allowing the designer to control the complexity of a description.

Other analysis tools have been developed around the Verilog® language, including fault simulators, and timing analyzers, and the language has provided input specification for some logic and behavioral synthesis tools. The language has been standardized as IEEE standard #1364-1995, and is described in detail in "The Verilog® Hardware Description Language," by Donald E. Thomas and Phillip R. Moorby, and is incorporated herein by reference.

Analog circuits are commonly simulated by SPICE (Simulation Program with Integrated Circuit Emphasis), a commercially available software program for simulating analog circuits. SPICE frees engineers from the laborious, and often complex, time consuming tasks of analog circuit analysis. SPICE was originally developed by a team at the University of California at Berkeley and consists of a set of powerful algorithms for a wide range of circuit analysis methods. Many of SPICE function have been implemented on a personal computer platform, as described in "The Illustrated Guide to PSPICE®" by Robert Lamey, which is incorporated herein by reference.

As with Verilog®, the SPICE language has been utilized in many other tools and simulations. In addition, various vendors and groups have attempted to apply similar principles to analog synthesis such as module generators (OPASYN, CADICS, and ADORE from UC Berkeley, and VASE from University of Cincinnati, for example) and topology optimizers (IDAC/ILAC or AutoLinear marketed by Silicon Compiler Systems, AMGIE by Leuven, ASTRX/OBLX by CMU, for example). However, no tools provided either commercially available tools or true synthesis of analog or mixed analog regardless of the underlying description languages or simulators.

SUMMARY OF THE INVENTION

The present inventors have realized that analog and mixed signal synthesis may be performed. Roughly described, the present invention allows a top down design of mixed-signal systems and combines a high performance, mixed mode, single kernel simulation with behavioral modeling of circuits, automated characterization, a mixed-signal cell library, and optimization algorithms.

The present invention performs computer aided design and realization of analog circuits. The realized analog circuits may be provided in any form, but are currently provided as fully dimensioned circuits or netlists that meet a users selected performance constraints and can be laid out (placed and routed) in a selected semiconductor technology.

The present invention meets at least two broad design objectives:

1. Increase productivity of the analog and mixed signal designer; and
2. Extend design capabilities.

The objectives are met by capturing the knowledge of an expert circuit designer (or cell designer/plan author) in how a circuit is constructed and partitioned, how to propagate higher level performance constraints to the lower, cell level, and in what order to synthesize the cells. The non-creative objectives met include activities like characterization, optimization, and simulation, once options and parameters for these activities have been decided.

Therefore, the benefits of using Antrim-MSS for analog design can be summarized as:

1. Capture of designer knowledge;
2. Shorten design cycle by automating time-consuming aspects of design, allowing the designer to focus on actual design issues; and
3. Make designer knowledge re-usable.

Benefits for extending design capability, include:

1. Enabling a top-down mixed signal design methodology; and
2. Execution of design plans without requiring a high level of analog expertise.

The invention is implemented by a synthesis engine that utilizes pre built plans for circuit design that include basic circuit topologies and paramaterized design criteria that has been fitted to a polynomial expression that synthesizes the circuit's operation. A plan author first builds a synthesis library of circuit designs and one or more plans for a specific circuit being designed or for general use. The plan captures the expert knowledge of the plan author for that specific type of circuit. Following users may then use the similar plan and need not know any particular details for designing that type of circuit.

In operation, a user of the present invention selects a plan from a synthesis library, and specifies a set of performance criteria, and the synthesis engine calculates a circuit fitting the input performance criteria. The synthesis engine outputs a sized netlist or other identification of the circuit design, a simulation script for later verification of circuit performance, and performance specs in the form of a datasheet.

BRIEF DESCRIPTION OF THE FIGURES

A more complete appreciation of the invention and many of the attendant advantages thereof will be readily obtained as the same becomes better understood by reference to the following detailed description when considered in connection with the accompanying drawings, wherein:

FIG. 1C is an overview of the major components of the MSS Synthesis library of the present invention;

FIG. 1D is an overview of the major components of the MSS Synthesis toolset of the present invention;

FIG. 1E is an overview of the major components of the MSS Synthesis Plans of the present invention;

FIG. 1F is an overview of the major components/activities of a plan author;

FIG. 1G is an overview of the major components/activities of a plan user;

FIG. 13 is an overview of the finishing steps of the synthesis plan.

DETAILED DESCRIPTION OF THE PREFERRED EMBODIMENTS

Figure 1A:
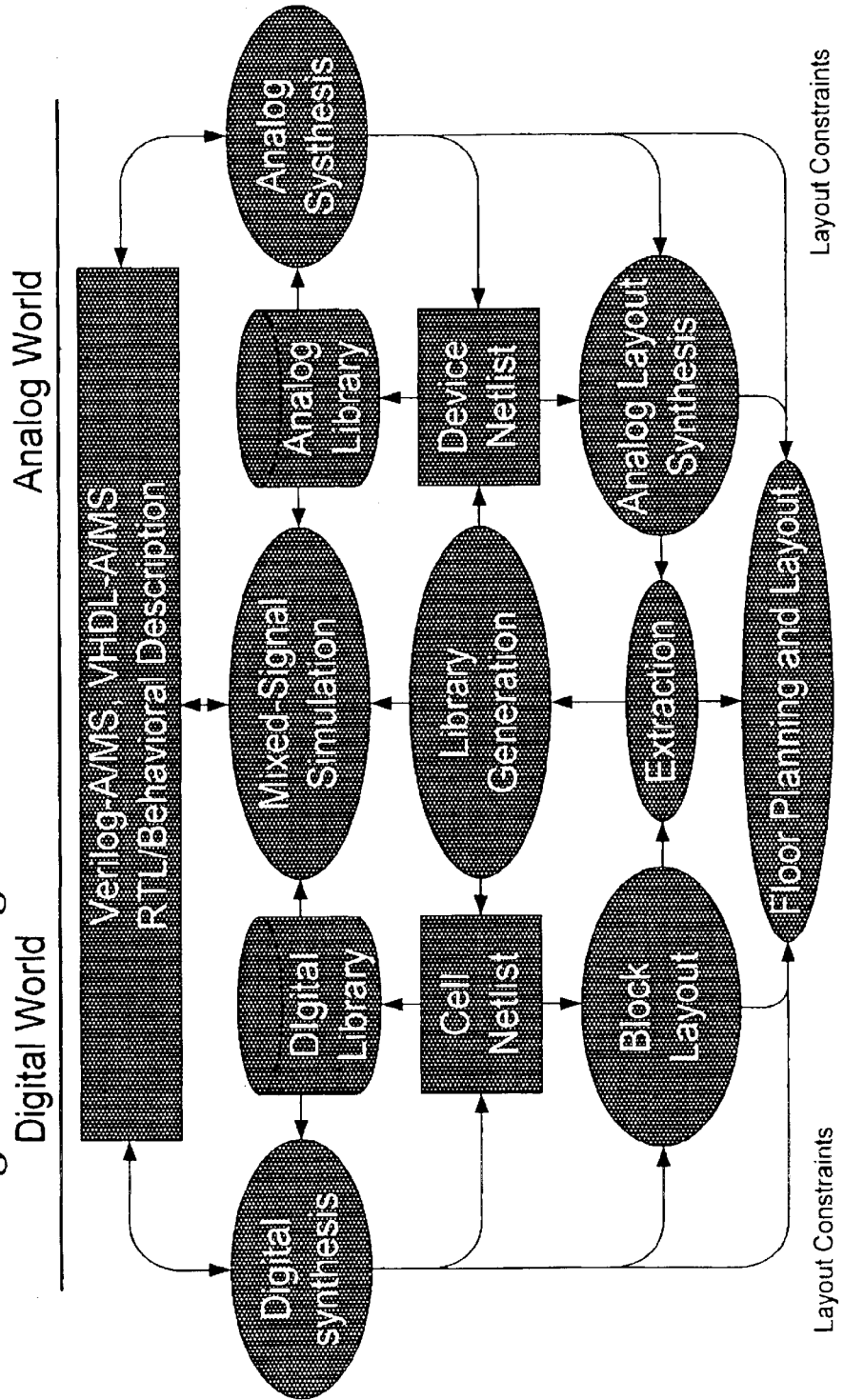
FIG. 1A is a block diagram illustrating the related functions to be combined in a mixed-signal development environment.
Figure 1B:
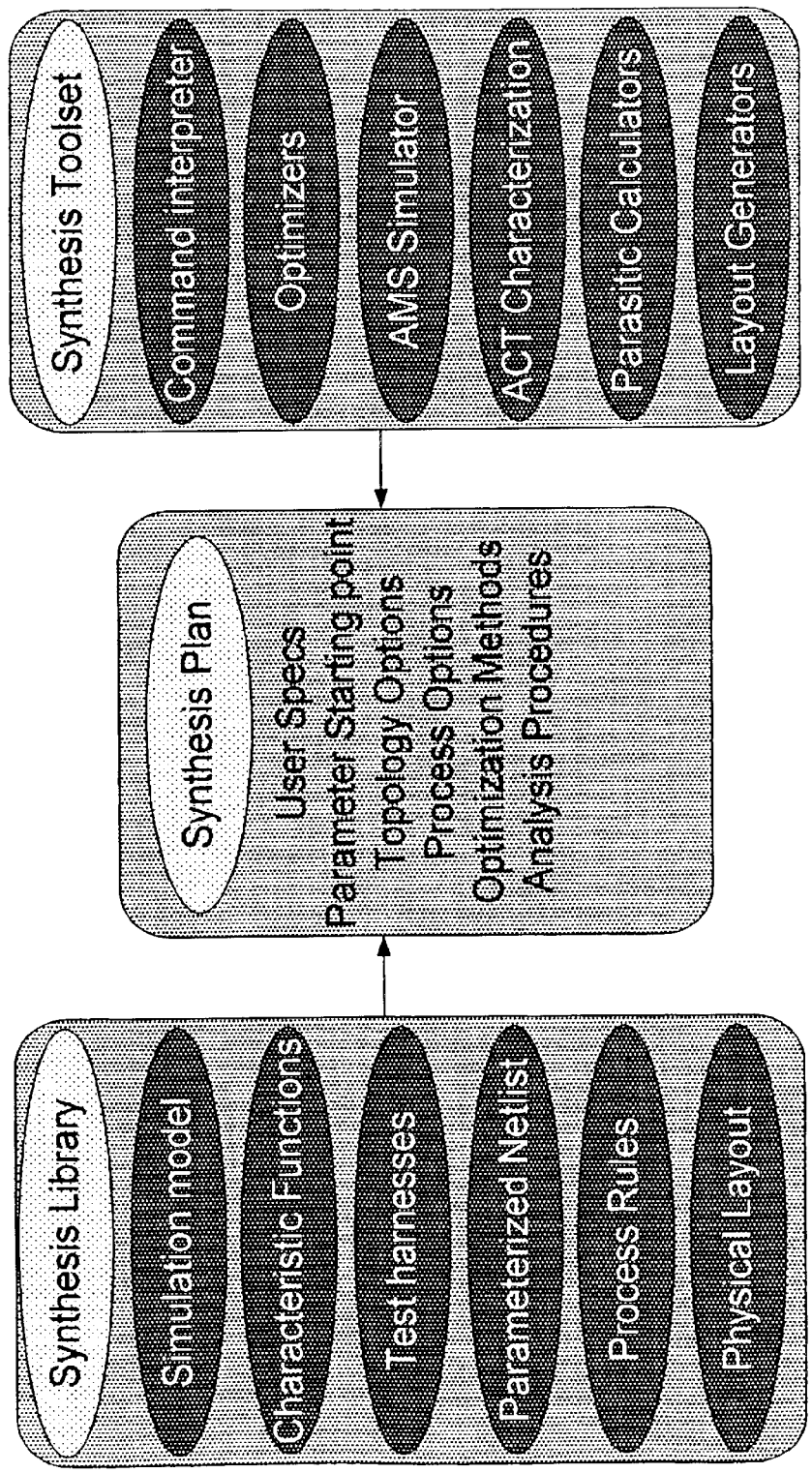
FIG. 1B is an overview of the MSS methodology of the present invention.
Figure 2:
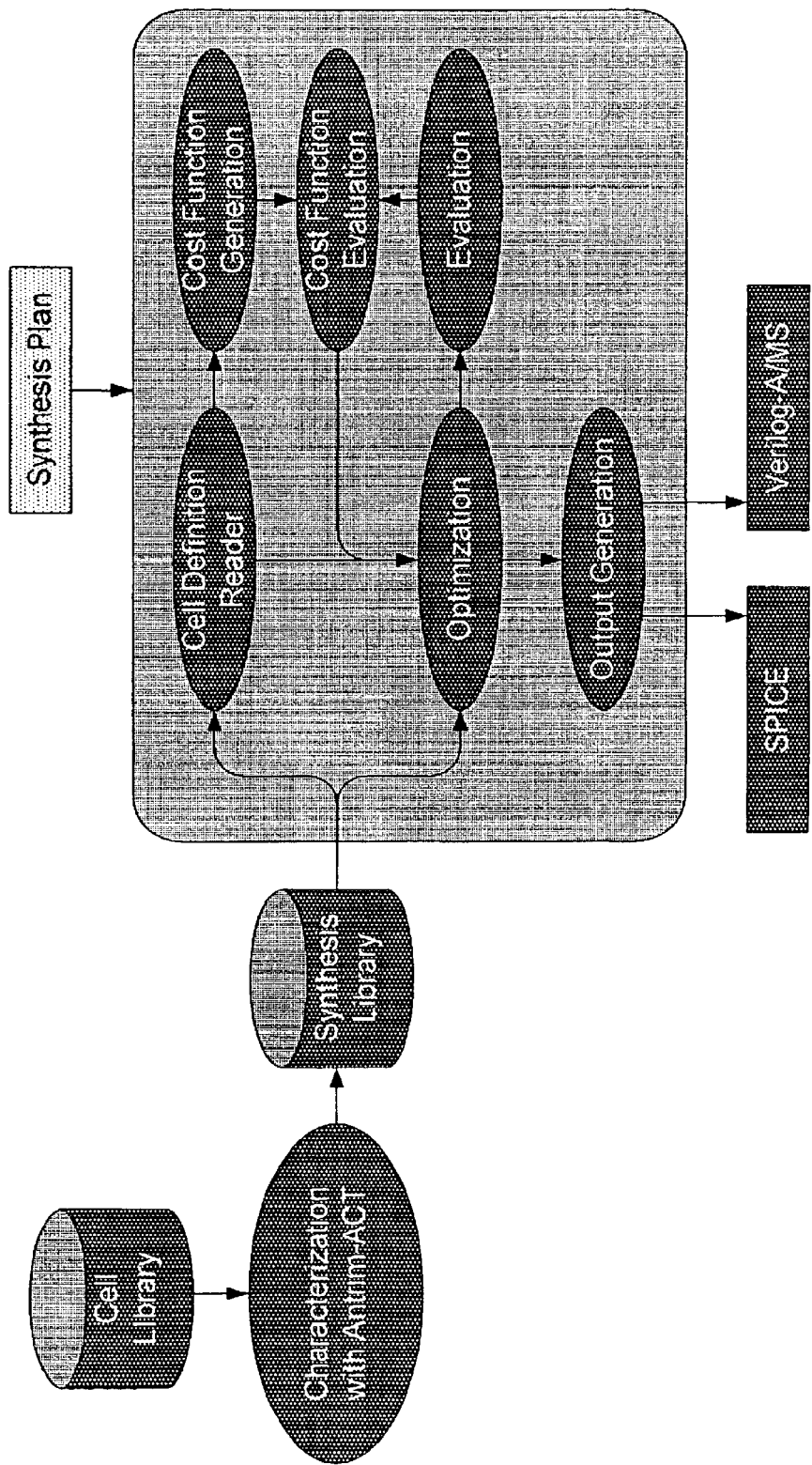
FIG. 2 is a block diagram of one embodiment of a mixed signal architecture according to the present invention.

Referring again to the drawings, wherein like reference numerals designate identical or corresponding parts, and more particularly to FIG. 1 thereof, there is illustrated a block diagram of related functions to be combined in a mixed-signal development environment.

1.1 Components of Antrim-MSS

The architecture and methodology of the Antrim-MSS product are built upon three components:

i. the Synthesis Library;

ii. the Synthesis Toolset; and iii. the Synthesis Plan.

1.1.1 Synthesis Library

The Synthesis Library contains the cell data required by Antrim-MSS. This includes the cell topologies (SPICE netlists), synthesis models of the cells, the performance characteristics and design parameters and their characterized limits, simulation scripts, test harnesses, and process files. Antrim-MSS provides tools to query and browse the Synthesis Library, as well as to select cells from it.

Explanation of Some Terms

Performance characteristics are measurements of the behavior of a circuit under various operating conditions. For example, power consumption may be a performance characteristic whose value needs to be as low as possible (minimized), or gain bandwidth may be a performance characteristic of an amplifier circuit whose value needs to be at least a certain amount (maximized), or center frequency may be a performance characteristic of a voltage-controlled oscillator that needs to be set to a particular value (an equality constraint). The user sets values (aka constraints) for each performance characteristic—these values are called performance specifications.

Design parameters are the variables in a cell model that need to assume hard values in order for the model to be simulated, and its performance characteristics evaluated. Design parameters are the variables that synthesis changes in search of a solution that meets the user's performance specifications.

1.1.2 Synthesis Toolset

The Synthesis Toolset is the set of software modules that perform specific tasks. These are optimization, simulation, characterization, and parasitic calculation. The tools are not configured to perform any particular fixed design procedure; rather each can be viewed as a generic black box that performs a particular task. The procedure and order in which these tools are invoked are specified in the Synthesis Plan.

1.1.3 Synthesis Plan

The Synthesis Plan is the encoded design procedure that when executed invokes the synthesis tools on the cells in a sequence that achieves the complete synthesis of the circuit.

1.2 Target Users

There are two classes of users: Plan Authors and Plan Users. The Plan Author is the primary expert designer whose knowledge is to be captured for reuse in a Synthesis Plan. He is also responsible for developing the Synthesis Library, which includes developing the synthesis models. He is also responsible for partitioning the circuit block into cells and deciding how to propagate constraints from the block to cells, what order to synthesize the cells, and how to propagate results from cell synthesis to other cells or to the higher level block.

The Plan User is the end user of a Synthesis Plan. He does not need to be an expert designer because he is not interested in how the circuit is designed, but is interested in obtaining a working circuit that meets his performance specifications. Therefore his main activities are in licensing the appropriate plan, specifying the performance specifications, executing the Plan and verifying the results.

The Plan User may or may not have access to the internal contents of the Plan depending on how the Plan is licensed to him. He may be the Plan Author himself in which case he can edit the Plan.

1.3 Synthesis Tasks

The successful synthesis of an analog circuit requires that three tasks be properly executed. These are:

i. Synthesis Library Development;

ii. Synthesis Plan Development; and iii. Synthesis Plan Execution.

Synthesis Library Development generates all necessary data (cell models, measures, test harness) and puts them in the Synthesis Library. This step is performed by the Plan Author. This task has to be executed first.

Synthesis Plan Development is the capture of expert design knowledge into a Synthesis Plan. This phase is expected to be the most knowledge-intensive.

This step is performed by the Plan Author. The object of developing a Synthesis Plan is to formally record the design procedure so that it is re-usable when the same circuit is to be migrated to a new technology.

Synthesis Plan Execution is the phase when the Synthesis Plan is interpreted by the Synthesis engine and its commands executed. The user selects the technology, sets the performance specifications and specifies the inputs. This step is performed by the Plan Author or Plan User.

These tasks are described in more detail later.

1.4 Antrim-MSS Output

Antrim-MSS produces the following output:

i. A sized netlist in SPICE or Verilog-A/MS;

ii. Antrim-AMS simulation script for verification; and iii. The actual performance specifications for the synthesized circuit in datasheet form.

Antrim-MSS also estimates device parasitic(s), not just capacitances, and can do NRD and NRS for resistance also. Capacitances given the design rules and the sized devices.

2.0 Synthesis Library Development

The development of the Synthesis Library is based on cell characterization with Antrim-ACT. Cell characterization involves a series of steps to analyze a circuit-level netlist for a targeted set of performance characteristics so that a higher level model of the circuit performance is produced. This model provides an efficient means for evaluation of circuit performance during optimization.

This process involves running pre-specified experiments (multiple simulation runs) to acquire data, analysis, and model generation.

2.1 Contents of the Synthesis Library i. Cell Definition—A file listing performance characteristics and design parameters. The file may contain all the performance characteristics and design parameters.

ii. Cell Model—A Verilog-A/MS description of the cell.

iii. Simulation Script—An Antrim-AMS script that is used during optimization (when Antrim-A/MS is called)

iv. A Starting Point Table—A table of design parameter versus performance characteristic points to be used as starting points for optimization.

v. Characterization Plan.

2.2 Cell Modeling

Developing a model for the cell performs the following:

i. Decide what performance characteristics to be modeled;

ii. Decide what parameters affect what performance characteristics;

iii. Decide how each performance characteristic is to be modeled;

iv. Acquire data necessary for the model;

v. Develop any measurement required for that performance characteristic; and vi. Generate the parameterized model.

2.2.1 Synthesis Models

The synthesis model of the present invention relates design parameters (the variables that optimization changes) to an observable (by evaluation or by measurement) performance characteristic such as power, gain, slew rate. That is, the synthesis model is 'parameterized'.

The type of model used for synthesis has a strong influence on how fast optimization will be, as well as how accurate the synthesis results will be. Synthesis cell models may be Analytical, Behavioral, and Circuit based. Behavioral models are an abstraction, and analytical models are based on physical models such as mosfet transconductance, for example.

A behavioral model may be analytic or a simulation model. An analytic model expresses the relationship between a performance characteristic and the design parameters that affect it as an algebraic equation with the design parameters as the independent variables and the performance characteristic as a dependent variable. Evaluation of that performance characteristic is then a direct evaluation of the equation given the design parameter values.

A simulation model gives the terminal I/O behavior and the required performance characteristic is then obtained by measurement of the simulated electrical waveform.

A behavioral model, in some cases, might not produce a waveform. For example, an equivalent of a DC simulation model that represents the power of a cell as a function of a set of design parameters. The optimizer would vary the design parameters and the measurement would produce a power result. There is no waveform required.

Circuit-Level Model

This is the parameterized SPICE netlist. Measurements are needed to evaluate the performance. In practice, we expect cell models for synthesis to be a mixture of any of the above. The Verilog-A/MS language is the modeling language—circuit-level models are embedded in the Verilog-A/MS model using the 'language construct'. Hence one unified evaluator (the Antrim-AMS simulator) is used during synthesis.

3.0 Target Cells for First Antrim-MSS Release

Phase-locked Loop:

VCO

Charge pump

Phase detector

Low-pass filter

Sigma-delta AD Converter:

Switched-capacitor integrators

Comparator

D/A converter

Building block circuits:

Op amps

Current mirrors

Voltage references

Current references

4.0 Antrim-MSS Use Model

There are two different use models: one for the Plan Author and another for the Plan User.

4.1 Plan Author Use Model

This use model allows the Plan Author to develop the Synthesis Library and to develop the Synthesis Plan.

4.1.1. Library Development

The following are the steps:

1. Parameterized the circuit netlist.

2. Model each performance characteristic in terms of design parameters.

3. Develop the test harness and measurements.

4. Develop the simulation script.

5. Defining starting points for design parameters.

4.1.1.1 Design Parameters

For each cell, there needs to exist the SPICE-level netlist. This is the primary input. The first step is to parameterize this netlist. All values in the netlist that can be altered during an optimization are represented by symbolic names rather than hard numeric values. Typical examples are transistors' widths and lengths, capacitances and resistances.

Some design parameters may not be optimization variables but are input parameters. An example is the current in a current source in the model, which may be set to different values before different optimizations but remain constant during optimization.

A synthesis plan will specify which design parameters are to be used as optimization variables, and which may be calculated through other means. As an example, an input design parameter such as bias current may result in building a current source that is dimensioned based on process design rules rather than numerical optimization.

An example of a parameterized netlist (design parameters wnb, lnb, ibias, wpdiff, lpdiff):

EXAMPLE 1

```
'language SPICE .include /usr/tools/antrim/mss/scl/models/
bsim3/model.typ
.SUBCKT delay_ibias INN INP OUTN OUTP control VSS
VDD +lnb=1u wnb=1.1u lpdiff=0.6u wpdiff=8u ibias=50u
M0 OUTN control VSS VSS NMOS_MOD L="lnb"
W="wnb"+AD=10P AS=4P PD=9.0U PS=3.6U NRD=0.3
NRS=0.3 M1 OUTP control VSS VSS NMOS_MOD
L="lnb" W="wnb"+AD=4P AS=10P PD=3.6U PS=9.0U
NRD=0.3 NRS=0.3
M2 tail INN OUTP VDD PMOS_MOD L="lpdiff"W=
"wpdiff"NRD=0.3 NRS=0.3 M3 tail INN OUTP VDD
PMOS_MOD L="lpdiff"W="wpdiff"NRD=0.3 NRS=0.3
M4 tail INP OUTN VDD PMOS_MOD L="lpdiff"W=
"wpdiff"NRD=0.3 NRS=0.3 M5 tail INP OUTN VDD
PMOS_MOD L="lpdiff"W="wpdiff"NRD=0.3 NRS=0.3
ibias vdd tail dc "ibias".ENDS CELL
'endlanguage
```

4.1.1.2 Modeling of Performance Characteristics

After the netlist has been parameterized, the designer decides what the performance characteristics are and develops the model for each performance characteristic.

There are several methods of behavioral modeling for synthesis:

1. Analytical equations
2. Tables

As discussed above, analytical equations should not be equated with behavioral models. Analytical models directly describe the physical behavior of a device as a function of design parameters. Examples of analytical models would be expressions of mosfet current as a function of terminal voltages, or small signal behavior such as mosfet transconductance.

A behavioral model may consist of a set of mathematical expressions that are empirically derived from measurements of circuit response. In behavioral models performance characteristics are expressed as functions of design parameters, through a curve-fitting process as an example.

Behavioral models may also be table based, directly representing a set of sampled points from a characterization of circuit response. The table contains values for performance characteristic measurements (the dependent variables) versus specific values of design parameters (the independent variables).

4.1.1.3 Developing the Test Harness

The cell (aka 'design under test' or 'DUT') is instantiated in a module called a 'test harness'. This test harness is a Verilog-A/MS module that includes measurement modules, voltage or current sources and any other modules that are required to simulate the DUT. An example of a test harness:

EXAMPLE 2

```
'timescale 100 ps/10 ps
'include "disciplines.h"
'include "connect.h"
module top;
    electrical ground, inn1, inp1, outn1, outp1, outn2, outp2,
        vctrl, vdd;
    electrical outn3, outp3, outn4, outp4, outn5, outp5, outn6,
        outp6;
    electrical outn7, outp7;
    delay_ibias cell1(inn1, inp1, outn1, outp1, vctrl, ground,
        vdd);
    delay_ibias cell2(outp1, outn1, outn2, outp2, vctrl,
        ground, vdd);
    delay_ibias cell3(outp2, outn2, outn3, outp3, vctrl,
        ground, vdd);
    delay_ibias cell4(outp3, outn3, outn4, outp4, vctrl,
        ground, vdd);
    delay_ibias cell5(outp4, outn4, outn5, outp5, vctrl,
        ground, vdd);
    delay_ibias cell6(outp5, outnS, outn6, outp6, vctrl,
        ground, vdd);
    delay_ibias cell7(outp6, outn6, outn7, outp7, vctrl,
        ground, vdd);
    delay_ibias cell8(outp7, outn7, inn1, inp1 vctrl, ground,
        vdd);
        frequency #(.trig(0.25), .occ(100), .dir(1), .filename
            ("freq. meas")) meas1(inn1);
    power #(.ibias(4.951908e-05)) meas2( );
    vdc_source #(.vdc(5.0)) vvdd(vdd,ground);
    vdc_source #(.vdc(3.0)) vvctrl(vctrl,ground);
endmodule
'language SPICE
.subckt vdc_source pin1 pin2 vdc=0 vdc pin1 pin2 "vdc"
. ends
'endlanguage
module power;
    parameter real ibias=50u;
    integer pfile;
    real powr;
    analog begin
        @(initial_step)
            pfile=$fopen("power.meas");
        @(final_step) begin
            powr=8 * ibias * 5;
            $fstrobe(pfile, "power % e", powr);
            $fclose(pfile);
        end
    end
endmodule
```

The DUT is called 'delay_ibias' (description shown in Example 1). The vdc_source modules are voltage sources that sets values for the supply and ground. The module 'power' measures the power consumption given the bias current.

4.1.1.4 Developing the Simulation Script

When the optimizer finds a solution, it calls the AMS simulator to simulate it to evaluate the performance characteristics. The simulator is called with a simulation script containing the AMS commands to be executed during each simulation. These are:

i. Set instance parameters to their values by specifying:
   set_inst_param("top.cell1", "lnb", $lnb)

There should be one such command for each design parameter. The actual numeric values assigned to these variables are found by the optimizer which automatically generates the assignments and sends them to the simulator.

ii. Set simulator options, such as:
set_sim_param("modopt", 0)
iii. Specify a simulation analysis such as
tran(1n,40n,0,0.1n)

4.1.1.5 Defining Starting Points for Design Parameters

A starting point is a set of design parameter values defining a point in the solution space which the optimizer uses as the initial solution. This can be specified by the user with the 'set_opt_param' command.

In one embodiment, only a plan developer is allowed to set a starting point for design parameter values. A plan userwould not have visibility of the design parameters, and would never directly execute set_opt_param. When new process technologies are applied to an existing plan, the limit and step values are changed appropriately.

For an initial value, the user specifies the lower and upper bounds on the parameter as well as the minimum step size, which is the smallest value the optimizer may alter this parameter by. The minimum step size represents a stopping criterion.

set_opt_param (<param_name>, <llim>, <starting_point>, <ulim>, <min_step_size>);

This command is explained in specifying a starting point in Section 4 (also see <starting_point> in set_opt_param).

4.1.2 Synthesis Plan Development

A Synthesis Plan may be implemented as a script in the Perl language. The Plan Author 'codes' his design knowledge directly in the language, making use of the control constructs and synthesis commands provided.

Antrim-MSS can also be used to perform optimization on a single cell. The decision to select a particular cell topology or a cell model is made by the designer. Commands are available to traverse a design hierarchy, optimizing each cell in turn and using the results from a particular cell as the starting point or as inputs to the optimization of another cell.

Synthesis commands are used to perform operations that collectively make up a Synthesis Plan.

In the following, commands are shown in "short-hand" mode.

4.1.2.1 List available libraries

An MSS installation may contain any number of cell libraries. The user can list all the libraries that have been installed.

Synopsis:

list_libs

Description:

Relative to the Antrim home $ANTRIM, the cell libraries available are searched and listed, with a description of each library.

Example:

MSS>list_libs
ANTRIM=/usr/tools/antrim
Synthesis cell libraries installed at $ANTRIM/mss/libs:

| Library name | Version | Description |
| --- | --- | --- |
| pll_cell_lib | v1.0b | Cells for phase-locked loop. |
| fa2d_cell_lib | v1.2c | Cells for flash A2D converter |
| ds_a2d_cell_lib | v1.0a | Cells for dual-slope A2D converter |

4.1.2.2 Selecting a Synthesis Library

The Synthesis Library is organized in the following hierarchy: library, function, cell. A library contains functions. Each function may have many different topologies, or models associated with it—simply called 'cells'. To synthesize a cell, a Synthesis Library, a function and a cell must be selected. This command allows the user to select the Synthesis Library.

Synopsis: set_lib <char *libname>

Description:

The user selects a Synthesis Library out of the list of libraries.

Example:

MSS>set_lib pll_cell_lib
Current cell library: 'pll_cell_lib', version v1.0b.
Path: /usr/tools/antrim/mss/libs/pll_cell_lib

4.1.2.3 Showing the current selected Library

The user can query what the currently selected Library is.

Synopsis:

show_lib

Description:

The system displays the current value of the Library setting.

Example:

MSS>show_lib
Current cell library: 'pll_cell_lib', version v1.0b.
Path: /usr/tools/antrim/mss/libs/pll_cell_lib

4.1.2.4 Listing available functions in the selected Synthesis Library

A function is an entry in a Synthesis Library representing a circuit class, such as op amps, VCOs, filters. A function may have several different topologies, or different models. Having selected a Synthesis Library, the user can list the available functions in it.

Synopsis:

list_funcs

Description:

All the functions in the current library are listed, with a description of each.

The current Library must be set.

Example:

MSS>list_funcs
Current cell library: pll_cell_lib
Path: /usr/tools/antrim/mss/libs/pll_cell_lib

| Function | Description |
| --- | --- |
| vco | Voltage-controlled oscillator |
| pfd | Phase/frequency detector |
| ipf | Low-pass filter |

4.1.2.5 Selecting a function

The user selects the function using this command.

Synopsis:

set_func <char *function_name>

Description:

Sets or overwrites the current function setting.

Example:

MSS>set_func vco
Current function: 'vco', version v1.0
Current cell library is: pll_cell_lib
Path: /usr/tools/antrim/mss/libs/pll_cell_lib

4.1.2.6 Listing the available cells

Having selected the function, the user can list all the available cells under it.

Synopsis:

list_cells

Description:

Lists the available cells in the current function.

Example:

MSS>list_cells

Current function: vco

Current library: pll_cell_lib

Path: /usr/tools/antrim/mss/libs/pll_cell_lib/vco

| Cell Name | Description |
|---|---|
| vco_80 | 80 Mhz voltage-controlled oscillator |
| vco_200 | 200 Mhz voltage-controlled oscillator |

4.1.2.7 Selecting a cell

Having selected a function, the user can now select a cell for synthesis.

Synopsis:

set_cell <char *cellname>

Description:

Sets or overwrites the current cell.

4.1.2.8 Selecting a process

The set_process command is used to select the technology process.

Synopsis:

set_process <char *processname>

Description:

Selects a technology process and sets or overwrites the current process.

Example:

MSS>set_process tsmc_018

Current process is: 'tsmc_018', version v1.0

Path:

/usr/tools/antrim/mss/libs/pll_cell_lib/vco/vco_80

4.1.2.9 Listing available processes

All available processes can be listed with the list_procs command.

Synopsis:

list_procs

Description:

All the process models in the current installation are listed, with a description of each.

Example:

MSS>list_procs

Process models installed at: /home/fred/cvs/MSS/scl/models

| Process Model | Version | Description |
|---|---|---|
| cmos07 | v1.0 | Process model for cmos 0.7 micron |
| tsmc_018 | v1.0 | Process model for tsmc 0.18 micron |

4.1.2.10 Setting a design location

A design location is the directory to which results are to be stored.

Synopsis:

set_design <char *designname>

Description:

Sets or overwrites the current design. The current working directory is changed to the new design directory.

Example:

MSS>!!pwd

/home/fred/work/nakamichi

MSS>set_design stage1

Design path: /home/fred/work/nakamichi/stage1

MSS>set_design /home/user/working

Design path: /home/user/working 4.1.2.11 Changing to the current design location The current design location is where results will be written to. It is necessary to 'go to' that location. This is done with the 'go_curr_design' command.

Synopsis:

go_curr_design

Description:

Change directory to the current design location.

Example:

MSS>set_design stage1

Design path: /home/fred/work/nakamichi/stage1

MSS>go_curr_design

MSS>!!pwd

/home/fred/work/nakamichi/stage1

4.1.2.12 Showing the current design location

The user can query what the current design location is with the show_design command.

Synopsis:

show_design

Description:

Show the current design.

Example:

MSS>show_design

Design path is: /home/fred/work/nakamichi/stage1

4.1.2.13 Saving the current design

Synopsis:

save_design <char *tar_file_name>

Description:

Compresses and saves the design in the current design directory to the archive file specified by tar_file_name. An "mss_design_settings" file will be created and included in the archive for later use in verifying version correctness when restoring the design. See "restore_design" below.

Example:

MSS>save_design test.tar

Saved design: /users/fred/nak/stage1 to file: test.tar 4.1.2.14 Restoring a saved design Synopsis:

restore_design <char *tar_file_name>

Description:

Resores a previously saved design whose archive is in tar_file_name. The design is restored to the current directory. If the design references library items whose versions are not current, the restore will fail. Upon restoration, the current design will be set to the current directory.

Example:

MSS>!!pwd

/users/fred/nak/stage1

MSS>restore_design test.tar

Restored design from: test.tar to /users/fred/nak/stage1

4.1.3 Optimization

MSS provides a very versatile way of specifying performance constraints and goals. The user can choose a particular optimization objective: maximize, minimize or meet a specific goal (i.e. an equality constraint) for a given performance characteristic. He can specify a target ('goal') or just specify limits that describe a range. That is, any solution found within the range is a usable solution. A range may be unbounded at one end to support minimize and maximize objectives. For the maximize objective, the lower limit is required and the upper limit is not applicable. For the minimize objective the upper limit is required and the lower limit is not applicable. For a 'goal' objective, both limits are required.

The optimizer works at two effort levels: HIGH or LOW (see Running Optimization).

At HIGH level, the optimizer tries its best to meet the goal, if one is specified. If the goal is not specified and the objective is minimize, the first solution found below the upper limit is returned. If the objective is maximize, the first solution found above the lower limit is returned. If the objective is an equality constraint, the optimizer considers the midpoint between the limits as the goal.

At the LOW effort level, the optimizer disregards the goal if one is specified. For a maximize objective, the first solution found above the lower limit is returned. For a minimize objective, the first solution found below the upper limit is returned. For a goal objective, any solution found between the limits is returned.

Finally, each performance spec has a 'weight'. This is a number from 0 to 1 that tells the optimize how to prioritize among multiple performance specs. The weight determines how much each performance spec contributes to the overall cost function. The overall cost is a weighted sum of individual cost components, one for each performance spec.

The optimizer seeks to obtain an overall zero cost solution. A zero-cost solution represents the optimum solution—it is one that meets all the specified constraints. For a 'HIGH' effort level, if a goal is specified for a particular performance spec, a solution that meets that goal contributes zero to the overall cost. Deviation from the goal towards the limits increases the cost linearly. Going outside the limits penalizes the cost component by a factor of 1E6. If the goal is not specified and the objective is maximize, the first solution above the lower limit contributes zero cost. If the objective is minimize, the first solution below the upper limit contributes zero cost. If the objective is 'goal', the midpoint between the limits contributes zero cost.

For a 'LOW' effort level, if the objective is maximize, a solution above the lower limit contributes zero cost. If the objective is minimize, a solution below the upper limit contributes zero cost. If the objective is 'goal', a solution between the limits contributes zero cost. See FIGS. 4A–4D, for example illustrations.

4.1.3.1 Setting performance specifications

The set_spec command is used to specify a performance spec:

Synopsis:

set_spec <perf_char><objective><llim><goal><ulim><weight> where:

perf_char: (char *) name of the performance characteristic objective: (char *) type of optimization (min, max, or goal).

llim: (char *) lower limit goal: (char *) goal ulim: (char *) upper limit weight: (char *) weighting of this item in cost function Note: lower limits are either strings representing valid floating point numbers or are set to undefined with "-".

Description:

Sets an individual performance specification for optimization. The user specifies all parameters. Violation of the following will generate warnings:

<llim>should be greater than or equal to the minimum value defined in the cell definition.

<ulim>should be less than or equal to the maximum value defined in the cell definition.

For goal optimization, both <llim>and <ulim>should be set. If a goal is defined, it is between <llim>and <ulim>.

Example:

MSS>set_spec trise min 1.2E-10 5E-10 19E-9 0.75

4.1.3.2 Specifying a starting point

One of the best ways for enhancing the speed of optimization is to specify a good starting point for the optimizer. A starting point is a set of design parameter values. To specify a starting point, each design parameter value is specified separately with the set_opt_param command. Besides the starting point, the user, who in this case is the plan developer also specifies what the lower and upper limits are, as well as the minimum step size that the optimizer is allowed to vary the parameter by.

Synopsis:

set_opt_param <param_name><llim><guess><ulim><min_step> where:

param_name: (char *) name of the design parameter llim: (float) lower limit guess: (float) starting point ulim: (float) upper limit min_step: (float) minimum step size Description:

Sets an individual device parameter for optimization. The user specifies all parameters. The following rules will apply:

The initial guess must be between the min and the max if they are specified.

Example:

MSS 206>set_opt_param MN1 W 1 2 3.000000002

Setting optimization parameter:

| Name  | Min | Guess | Max | Min Step  |
|-------|-----|-------|-----|-----------|
| MN1_W | 1   | 2     | 3   | .000000002 |

4.1.3.3 Running optimization

The 'optimize' command runs the optimizer:

Synopsis:

optimize [options]

Run optimization with specified options.

Options are:

effort [low |high] Specify the computation effort.

4.2 Plan User Use Model

The Plan User executes the following tasks:

i. Select a Synthesis Plan ii. Sets performance specifications iii. Executes the Synthesis Plan 4.2.3 Executing the Synthesis Plan The command to execute a Synthesis Plan is the 'do' command. The Plan is specified as a script to the 'do' command:

Synopsis:

do <script>

Description:

Execute the given script in MSS.

Example:

MSS>do plan

. . . runtime messages from plan execution

Behavior Models for Circuit Design Optimization

The present invention utilizes behavior models for circuit design optimization. The following is a description of the invention in a limited example describing the processes of the invention for a voltage controlled oscillator. As will be apparent to those skilled in the art, these processes are applicable to all types of analog circuits and may be modified or varied within the scope of the present invention as described herein.

Figure 3:
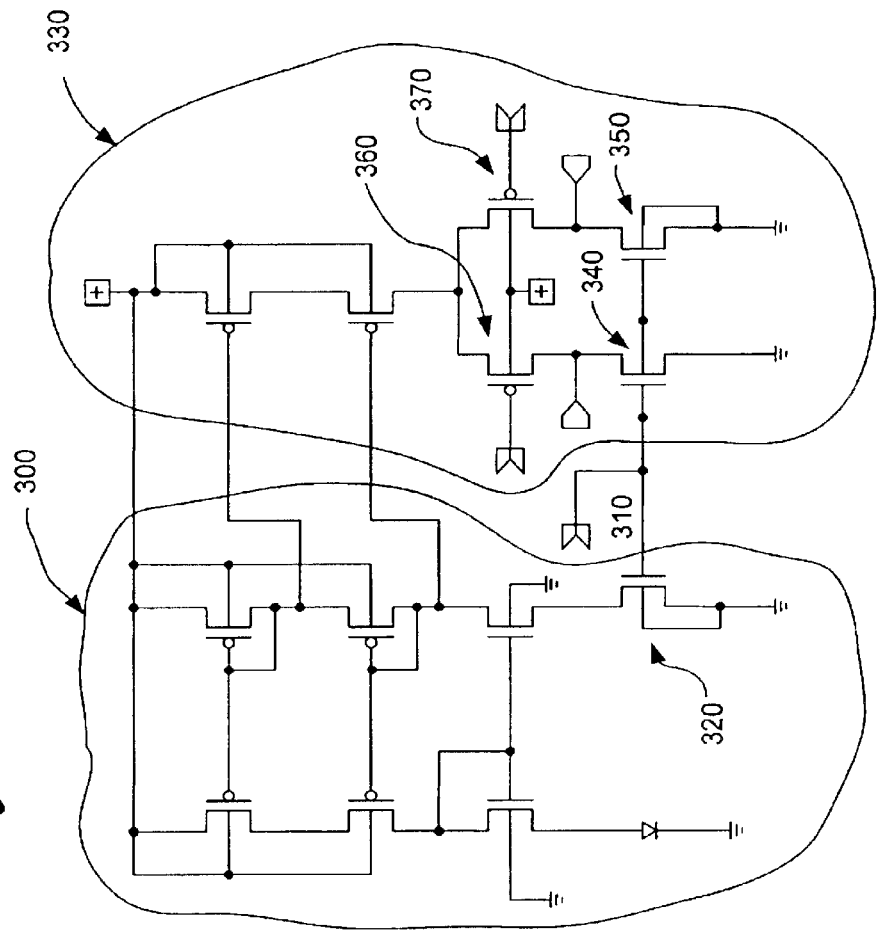
FIG. 3 is a circuit diagram of an example of VCO to be synthesized according to the present invention.
Figure 4B:
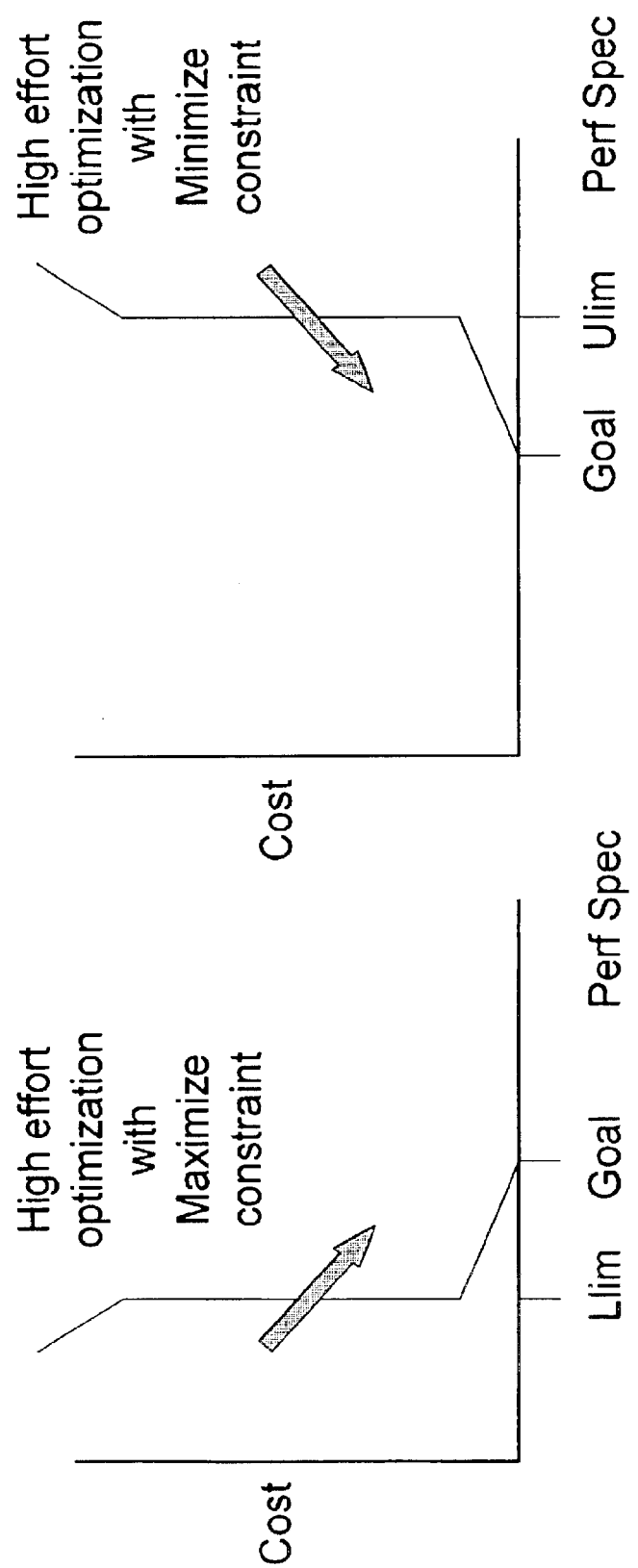
FIG. 4 is a block diagram of an example synthesis plan according to the present invention.
Figure 4C:
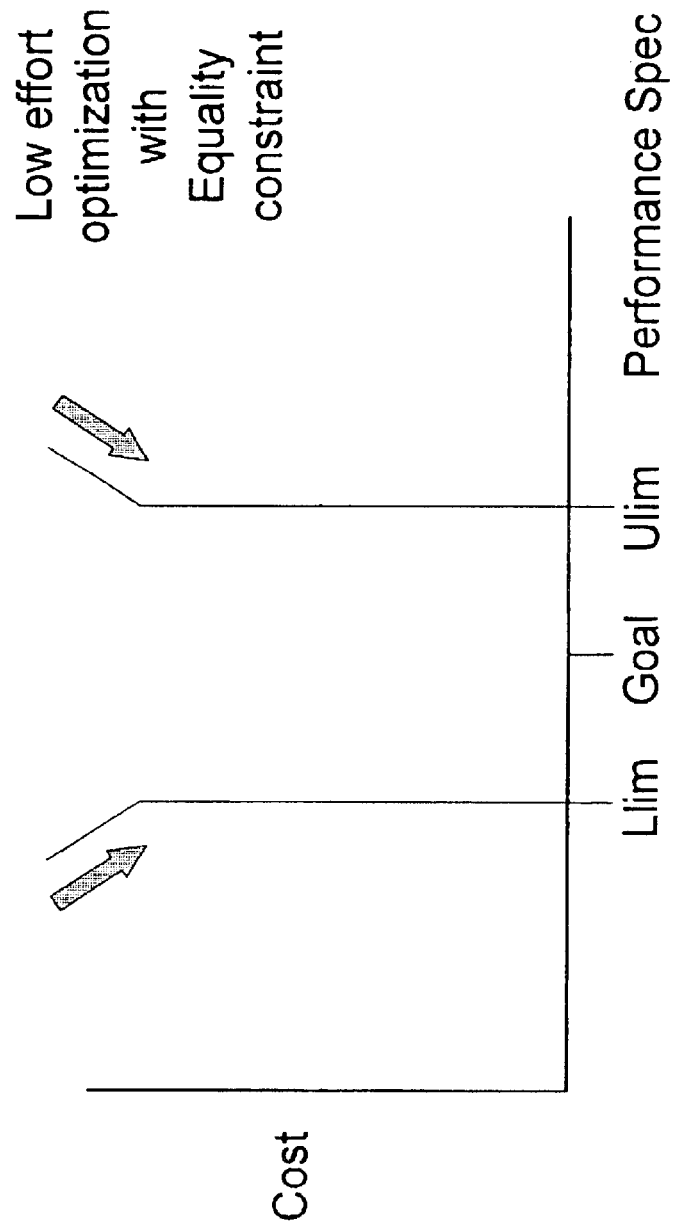
Figure 4D:
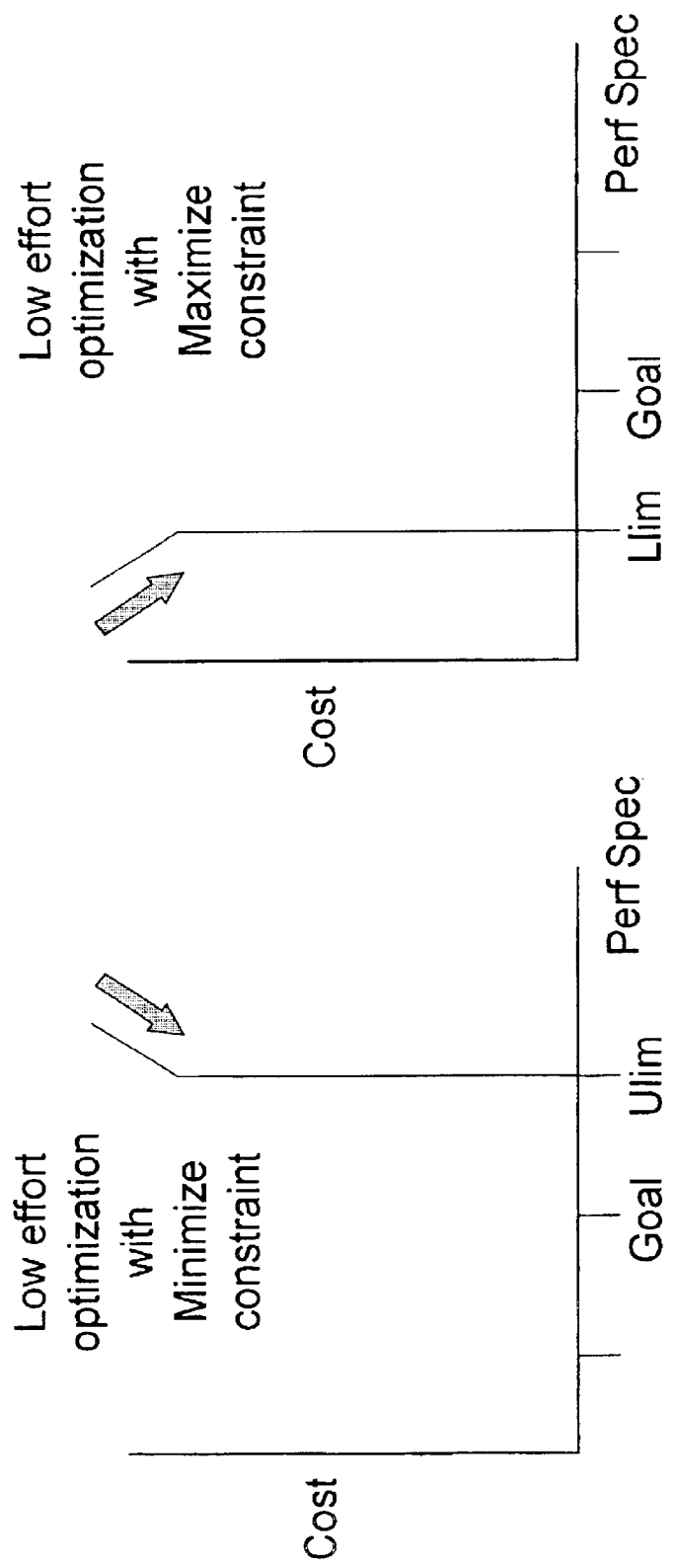
Figure 6:
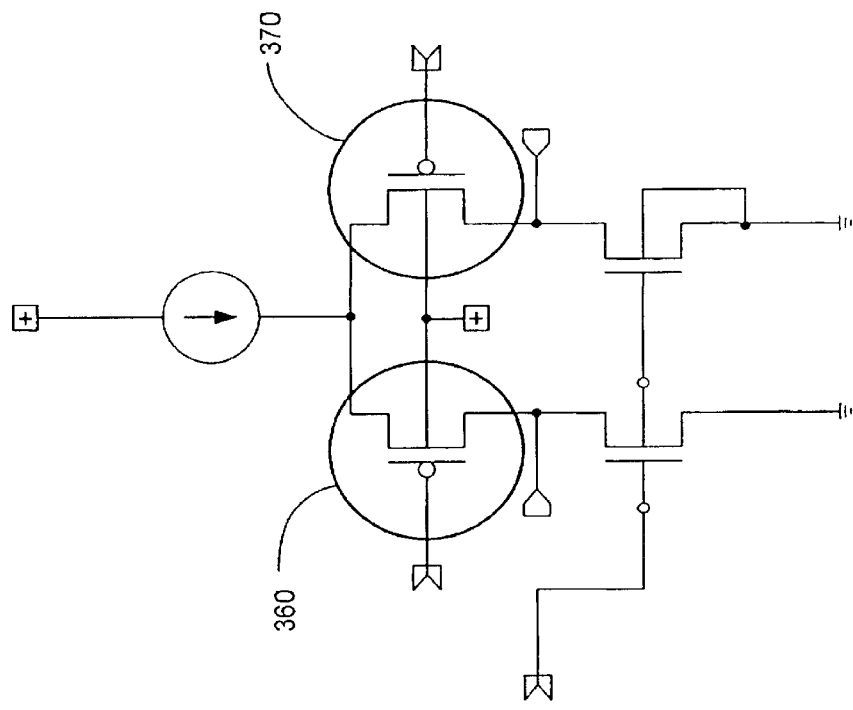
FIG. 6 is circuit diagram of delay cell transistors of the VCO to be synthesized.

FIG. 3 shows a simplified schematic for a portion of a voltage-controlled oscillator. The design is composed of two functional blocks, the bias control circuit and a differential delay cell. The differential delay cell is also depicted in FIG. 6. The delay cell in this example consists of six transistors. In a complete oscillator configuration there would be several delay stages connected to form a ring, where the outputs of one stage connect to the inputs of another identical stage, until the last stage connects back to the input of the first. For the proof of concept example, eight stages consisting of a total of forty-eight transistors make up the ring oscillator 100.

Figure 5:
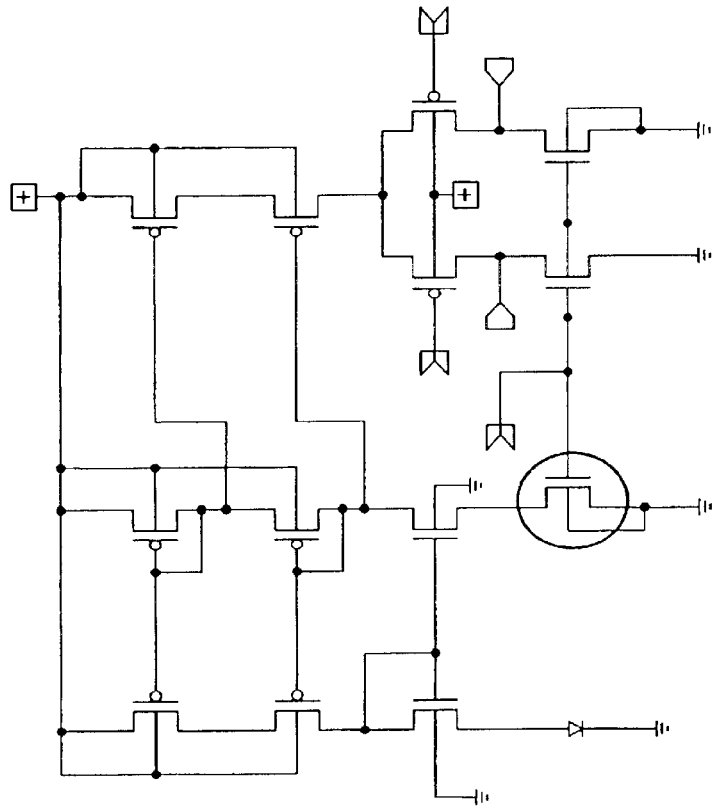
FIG. 5 is a block diagram highlighting a bias control transistor.

The performance of this circuit is established by selecting the values of the essential design parameters so that objectives for total power dissipation and oscillation frequency are met. Power dissipation is controlled by the eight-transistor bias generator circuit in FIG. 5. The essential design parameters of the bias cell are the dimensions of the highlighted transistor, enclosed within the circles in FIG. 5. Once the goals for power dissipation are established, the oscillation frequency is primarily determined by establishing the dimensions of the highlighted transistors in FIG. 6.

To perform a design optimization on this voltage controlled oscillator circuit, analysis would typically be performed by using a circuit simulation program such as SPICE. This would require solving the model equations for all forty-eight transistors in the ring oscillator 100, plus the eight transistors in the bias control circuit.

The results of a number of simulations of oscillator frequency for various settings of the design parameters produce simulations for the circuit. Simulations must normally be done at many of these various settings before an optimum set of values is found. This can require many iterations and a large amount of simulation time. In addition, when a new set of performance objectives are specified the entire process must be repeated.

Figure 8:
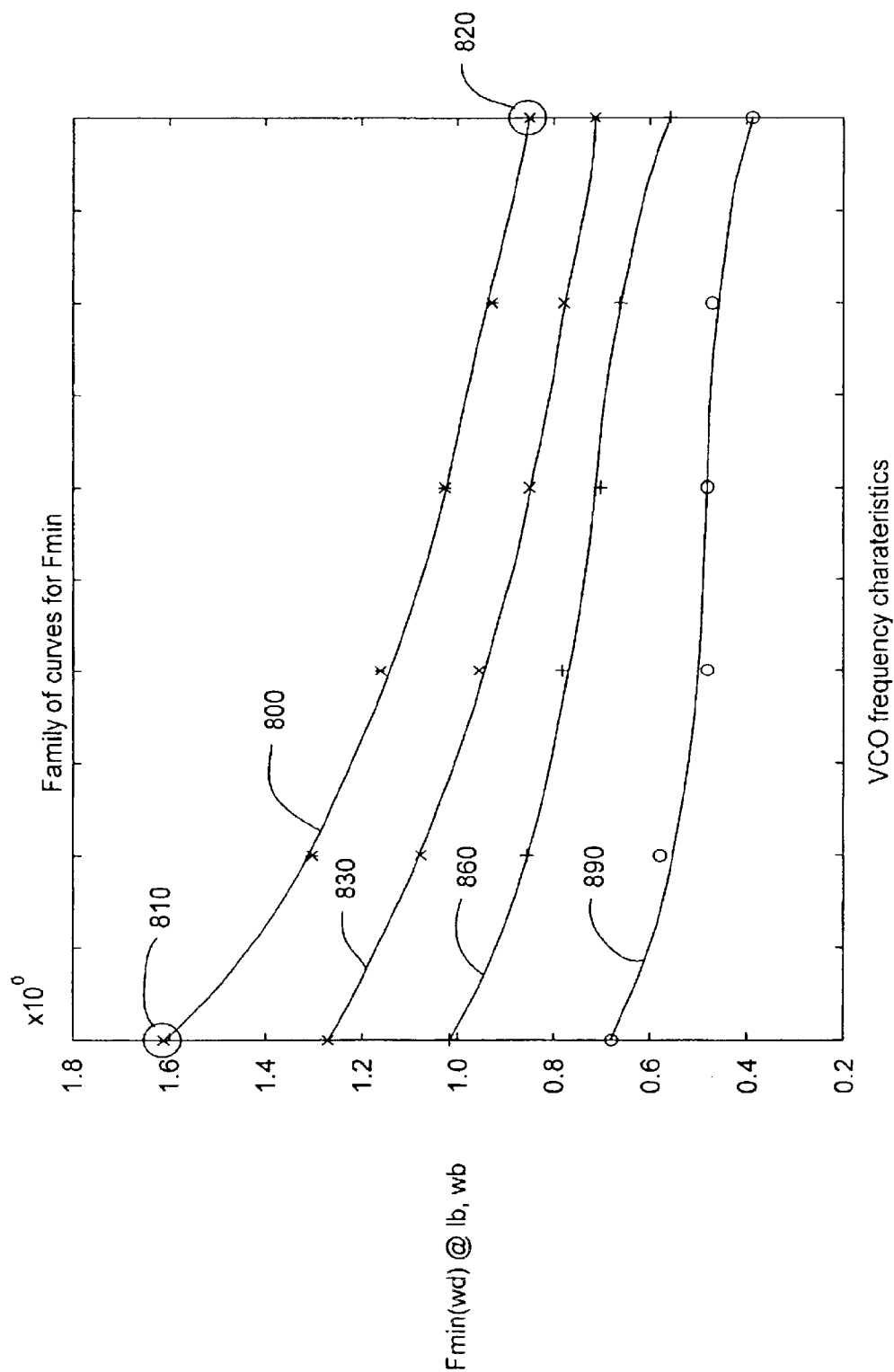
FIG. 8 is a graph of frequency characteristics of the VCO varying dimensions of a transistor according to the present invention.

In this new method of developing behavioral models for optimization, the repetitive simulations of transistor models are eliminated. This is accomplished by capturing the results of simulating a design once, and converting the circuit behavior to a model which can be analyzed much more efficiently. One example of this procedure is shown in FIG. 8, where curves are drawn through the data points produced by the SPICE simulations. These curves are produced by performing a mathematical fitting operation, to convert the characteristic behavior of the circuit to a polynomial expression. In this example the expression will describe the variation in the oscillator frequency that results when the width of the critical transistors in the differential delay cell are adjusted.

For a third order behavioral polynomial, the expression would be:

$$Fosc = a3*Wd3 + a2Wd2 + a1*Wd + a0 \qquad \text{(Equation 1)}$$

This polynomial expression can be solved directly by an optimization algorithm, without requiring any simulation of transistor models. In another implementation of the behavioral modeling method, the data points in FIG. 4 can be captured directly, and stored in a table. In this technique, the polynomial expression is not formed directly, and interpolation between data points is used to increase the precision of the model.

Referring now to FIG. 3, there is illustrated two vertical strings of transistors (on the left half of FIG. 3) that make up a bias cell 300, and down towards the bottom is a control input 310 that goes to the left into a bias control cell 320, and it also goes to the right into a delay cell 330.

In this example, these two circuits are separately optimized since the one on the left (300) is basically a DC circuit that just sets the power level and the one on the right (330) is actually one of the cells in an oscillator that would connect to several of those in the loop, into the ring oscillator 100 discussed above, for example.

So as our example, this circuit has various types of performance depending on the power that a designer might want and can afford to dissipate, and what frequency of oscillation might be wanted to be achieved (presenting the optimization problem of trying to minimize the power while maximizing the frequency). Optimization is performed by adjusting the sizes of the transistors. An expert designer's knowledge of this circuit or through a process of analysis it is determined that in the bias cell 300, only one transistor (bias control cell 320) controls the current and that's the transistor that has the control input 310. Therefore, the sizes of the other transistors are not critical to this optimization problem.

In a conventional optimization for the above-described circuit a designer would take the whole thing and either adjust all the circuits elements simultaneously if he hadn't already established any values or he'd have to pick them. But, in any case, the designer would be simulating the whole circuit. The present invention only adjusts the circuit element or elements (bias control cell 320 in this example), identified by the expert, which illustrates one way that the present invention models the performance of the circuit.

The delay cell 330 is more complicated, it gets a control input that's common to the bias control cell 320 and, of course, that controls the power because basically you have similar transistors that have that common input. But current that flows through the delay cell will also be used to drive an input of a subsequent cell. So adjusting the control input 310 and adjusting the size (the physical size on the chip or technology) of the two input transistors, 360 and 370, modifies both the power and the frequency simultaneously for that cell. So that's a more difficult optimization problem.

The effect of the sizes depends on the circuit. This is where the analog designer spends his time. Not only coming up with the circuit but what the sizes, dimensions, should be and how the device gets laid out.

Looking again at transistor 320 (bias control cell 320), if you make that transistor longer, the power goes down and if you make it wider, the power goes up. That would be the kind of thing we would be trying to optimize if we were just looking at power. If we look at those other two transistors (360 and 370) in the delay cell, they are in the circuit as an input so they present a certain capacitance that needs to be charged up and down as the oscillator oscillates back and forth. In that case, the designer would know that if the width of that transistor is increased, then the capacitance of that transistor is also increased. Therefore, the size of that transistor needs to be controlled. It's like a tuning element for the oscillator. If you've already decided what the current is going to be, then you've got to fix the amount of current that's charging or discharging a variable amount of capacitance, and the frequency of the oscillator is determined by that relationship. The size of this transistor needs to be selected to get the frequency that needs to be achieved.

Those parameters for the size are input into a SPICE simulation. The SPICE provides an initial characterization, either to build a table or to make measurements. Each point on the graph in FIG. 8 is generated with SPICE and represents one spice simulation. Each line represents a behavioral model that covers all of those points simultaneously with one equation.

The analog synthesis process of the present invention is based on having the MSS program automatically figure out the sizes of these transistors (320, 360, and 370, for example). The designer doesn't know before he starts what they should be to achieve the desired performance. The designer's approach to it would probably be to try and pick some values and manually adjust them until he gets something close to what he wants, or he might try and get it close, and then he might to try and run an optimization program on them that would try and adjust them, and that takes a lot of compute cycles to figure that all out.

In the present invention, the curves represent different levels of power and different levels of frequency (power and frequency characteristics). For example, any one of those lines in FIG. 8 represents varying the width of those transistors over a certain range. On the X axis it says wd=6 $\mu$–18 $\mu$. That's varying the dimensions of the transistor from 6 microns to 18 microns. The designer wants a certain frequency but doesn't know how big the transistor should be to achieve it. So the graph, in effect, varies the dimensions of the transistor from. 6 microns to 18 microns and shows what effect it has on the oscillation frequency.

For example, looking at the top most curve, curve 800, at 6 microns it shows a 1.6 data point 810, that's 160 MHz. Over to the right where it would be 18 microns, it shows something right around 1 at data point 820, a little over 100 MHz is produced. So for that particular set of dimensions, if we vary the width of that transistor from 6 microns to 18 microns, the oscillation frequency changes from 100 MHz to 160 MHz. If a designer wants 120 MHz, or 150 MHz, he doesn't know. The circuit designer could do a rough analysis or he could actually run the simulations to get a more accurate calculation or estimation of what the dimensions should be to achieve the desired frequency.

The present invention takes the circuit, characterizes it, by running the device dimensions over a certain range of allowed sizes. Once that is done, it doesn't have to be done again. The characteristic has a certain shape to it and an equation can be made that duplicates it.

A curve fitting algorithm can be used to represent the kind of relationship provided by the starred data points (810 and 820, for example). An equation such as equation 1 would be referred to as a third order polynomial because it has three terms in it that relate that value, the width, the wd in equation 1 is the wd that was varied in the simulations. FIG. 8 illustrates the starred points, each one of those is a measurement from a simulation. The curve of FIG. 8 is plotted by running those same and other values of wd through equation 1, and drawing the line that would result. The curve goes pretty close to all the starred data points.

This process is a combination of characterization and modeling, because the process of capturing those data points would be characterization. The process of converting them to an equation that duplicates that characteristic is modeling. The process takes the performance (characteristics) of a circuit and converts them to a model that's represented by an equation.

The present invention is not doing approximations, it is actually calculating and developing functions that represent the actual behavior that has been measured from an actual circuit or measured from the simulation. Preferably, more points gives a better curve, but at a minimum of probably three. Two points always gives you a straight line (which may be acceptable for some circuits) and how many are actually used is under the judgment of the person that's doing it. Alternatively, the software could specify a minimum number of points (three, for example).

Lines 830, 860, and 890 in FIG. 8 represent other dimensions in this circuit that are important. In this case, the bias control transistor 320 dimensions are varied so we get a different curve for the oscillation frequency, depending on the selected dimensions of transistor 320. So this becomes the total characteristic for the circuit illustrated in FIG. 3. There's three variables that we have here. The length and width of the bias control transistor 320, and the length and the width of the transistors 360 and 370 (but for purposes of the example, their lengths are fixed and only their width is varied). So it provides a total of three design variables that we can adjust for example purposes.

In this case, the graph could have been drawn as a three dimensional surface because a family of curves is present. The only axis that you see is the width axis but implicit in each of those curves is a pair of values for the width and length of the bias control transistor 320 as well. So you could have had three axes where one was width, and one was length of one transistor, and one was the width of transistor 320. Other combinations and graphs representing these and other dimensions are also contemplated.

So in our actual example, when we run it what we do is we first do the optimization on the transistor in the bias circuit which gives us two of the three values that we need and we use that to pick which curve in that graph that we use for the last transistor.

Stated differently, is that each one of these curves in the graph would represent a different set of the A3–A0 parameters that you see in equation 1. Those coefficients, A3, A2, A1, and A0, you get a different set of those for each set of values for the length and width of that first transistor.

The curve is selected, and the values for the curve are first determined by picking the sizes of the transistor. We do that by optimizing its dimensions for the power. We know that it controls the power of this circuit so we sized it in order to choose that result first. Once we know that, we know what the coefficients of the curve are for the other equation. For the general use of this modeling technique, it's not important. It simply explains why there's so many curves in that graph, that's what they represent. A graph with one line in it would have been just as illustrative of most of what we're talking about.

A feature of the present invention is that the design uses the model and doesn't care where the model came from.

When looking at the equation (model) the designer doesn't know anything about the circuit it depicts. It's what we call a completely behavioral model. It's not physical in anyway. It's just derived from behavior measured during characterization. The models others have used have always had some physical representation of what the circuit was doing and the transistors that made it up. Their equations would have physical parameters of the device. A physical model like the transistor equations that SPICE uses, for instance.

Figure 7:
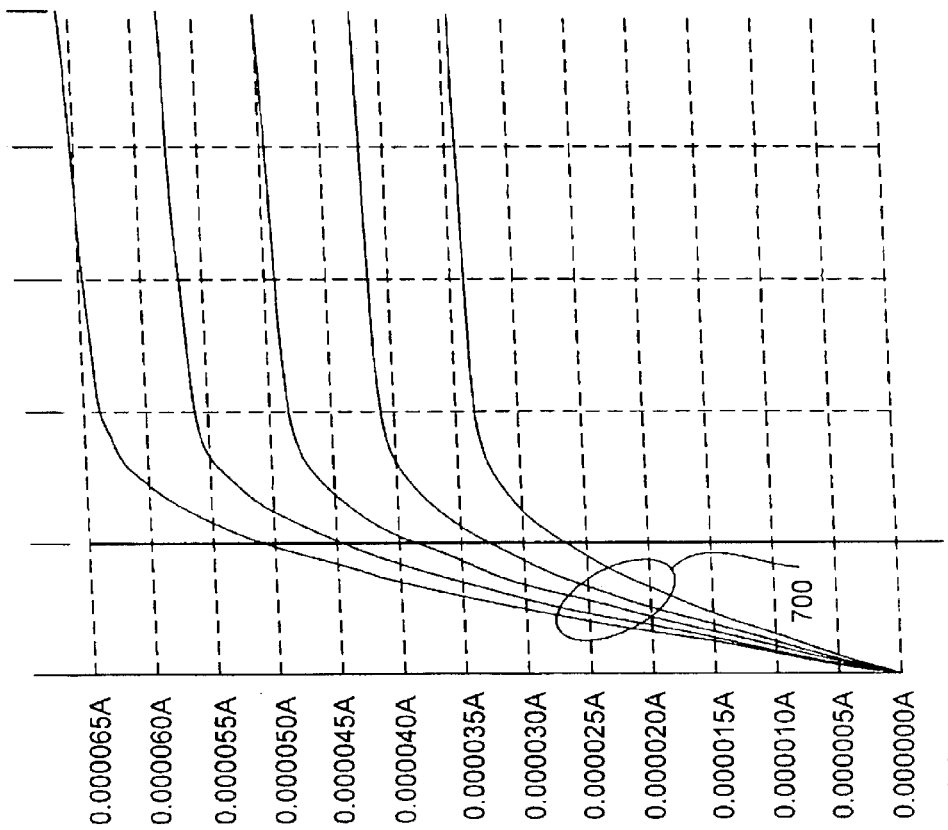
FIG. 7 illustrates initial characterization graph that represents the kind of measurements that will be made in picking the size of a bias control transistor.

FIG. 7 illustrates initial characterization, and is a graph that represents the kind of measurements that will be made in picking the size of the bias control transistor 320. In the characterization process, the present invention generates those kinds of curves and measurements automatically. By showing curves 700, it demonstrates the characterization side of this process. The circuit is characterized and its behavior is measured to build a model. The above discussion addresses this process by mentioning that a lot of SPICE simulations would be used normally, and then discusses the modeling process and how the model is used.

Figure 9:
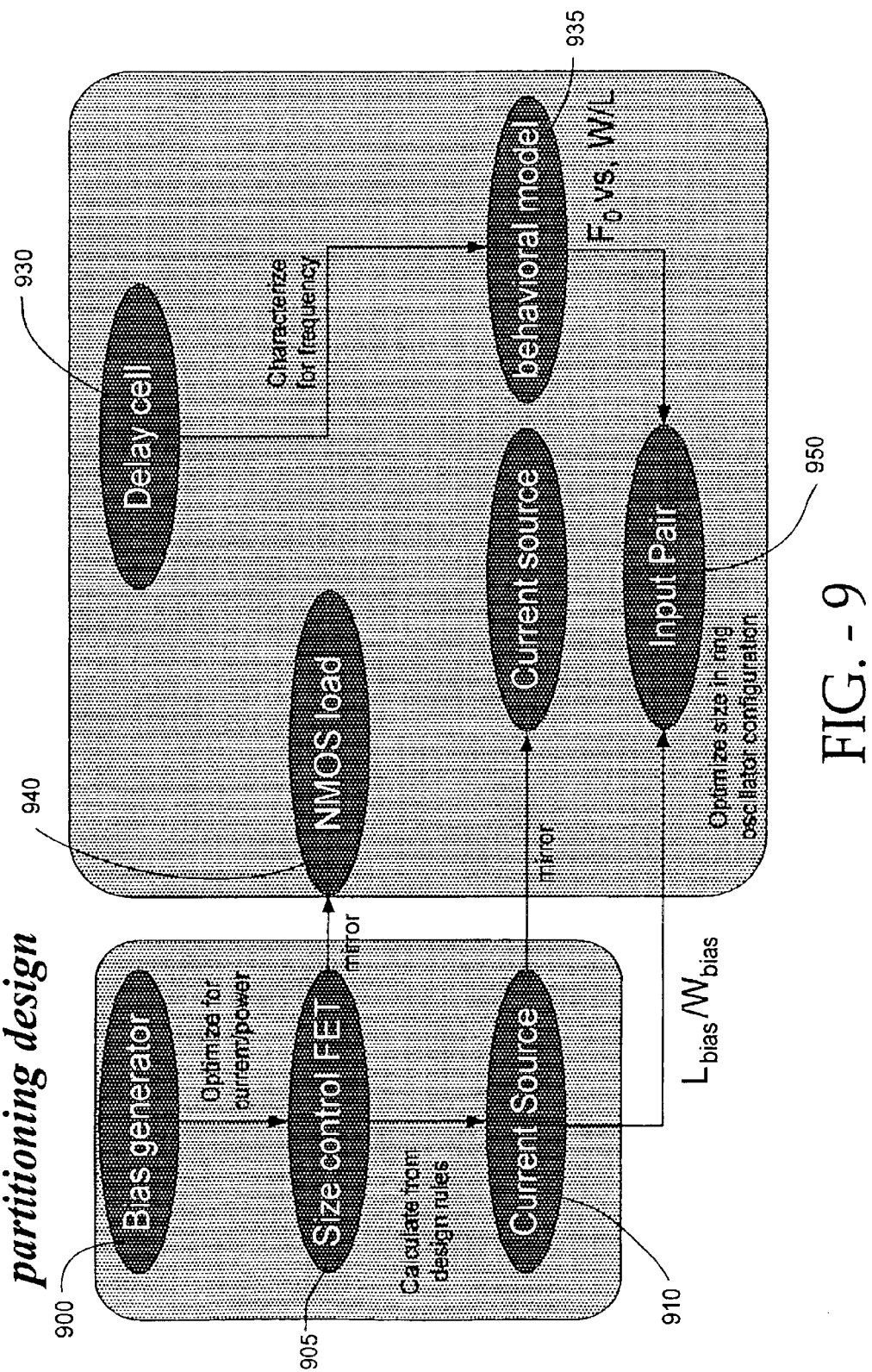
FIG. 9 is an example Synthesis Plan according to the present invention.

FIG. 9 represents the overall MSS system, illustrated as a flow diagram of how the MSS software would work to implement these processes, starting by representing the two cells 900 and 930 (representing the bias and delay cells discussed above). So we take the whole circuit for the oscillator, we split it into two separate cells 900 and 930, and the MSS software works on each one somewhat individually.

The first step 905 is to come up with dimensions for the control transistor (i.e., the bias generator cell 900, representing the bias control cell 320, for example). An objective of the MSS software is to build up this entire circuit so that when you're done you've got dimensions for all the transistors and it works according to the specification that was set for it. So the flow diagram/bubble charts of FIGS. 9–12 depict the steps that would be executed along the way in building up that circuit (lightened bubbles designate completed steps).

At various points models are used rather than actually simulate the whole circuit, and that's where the behavioral models (polynomial equation 1, for example) for optimization come in. The MSS methodology is to characterize the circuit and develop the models so that later on when a designer wants to synthesis the circuit for a certain level of performance, he goes back and reuses those models, rather than needing to reuse the whole circuit again. The "characterize for frequency" flow from delay cell 930 points into a behavioral mode 935. So that's the model that we're talking about here.

Figure 10:
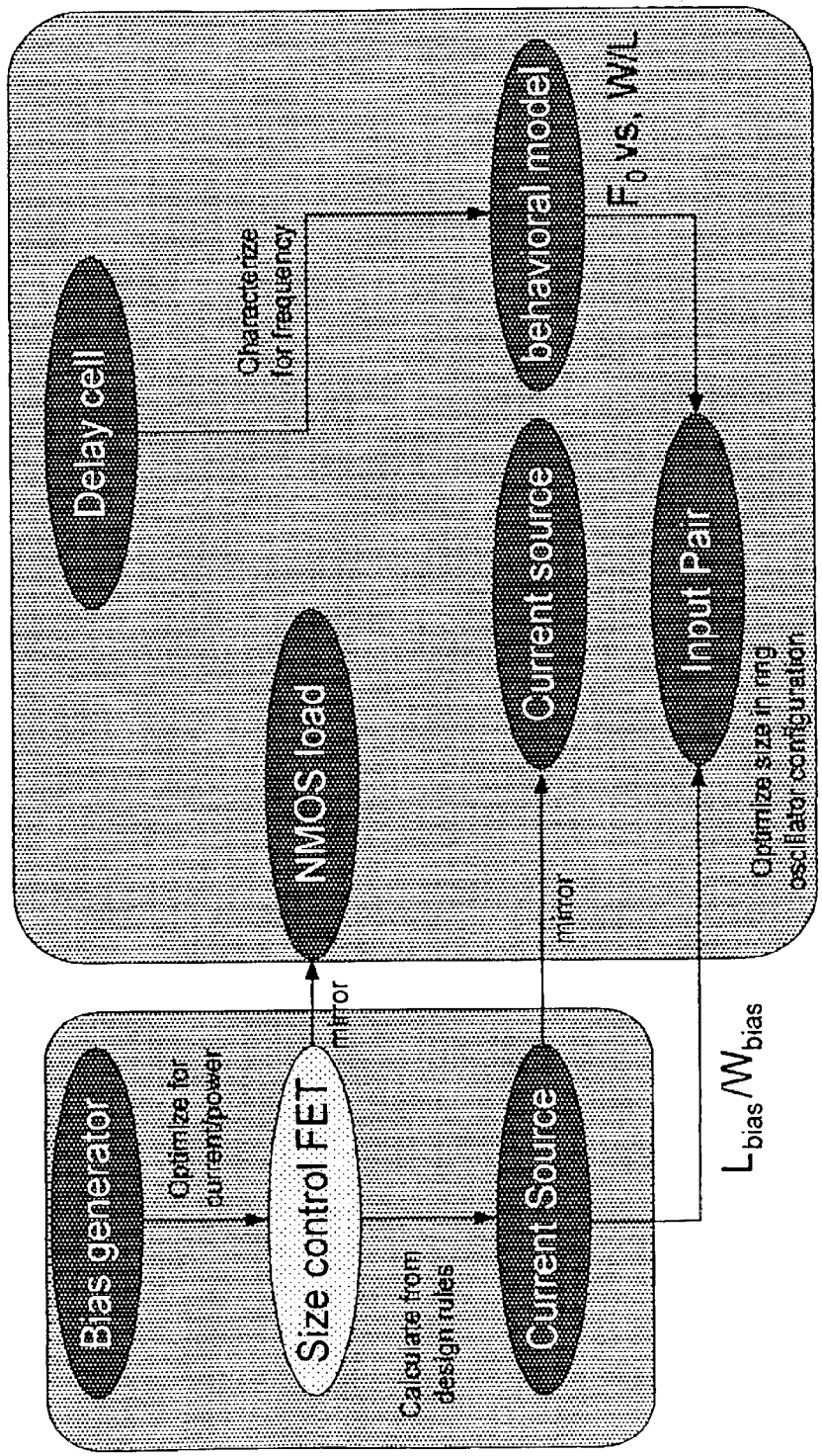
FIG. 10 illustrates the execution of a first step in the synthesis plan.

For example, the polynomial equation 1 is the behavioral model for that circuit so that equation is used during synthesis to come up with dimensions for the transistors. Using that model, we come up with what the dimensions should be, then we plug them back into the circuit, rather than have to use the circuit the whole time. So step 1, note FIG. 10, is size control FET 905, basically figures out what the size should be. Leading into that bubble it says optimize for power, so the size is selected for optimal power.

Figure 11:
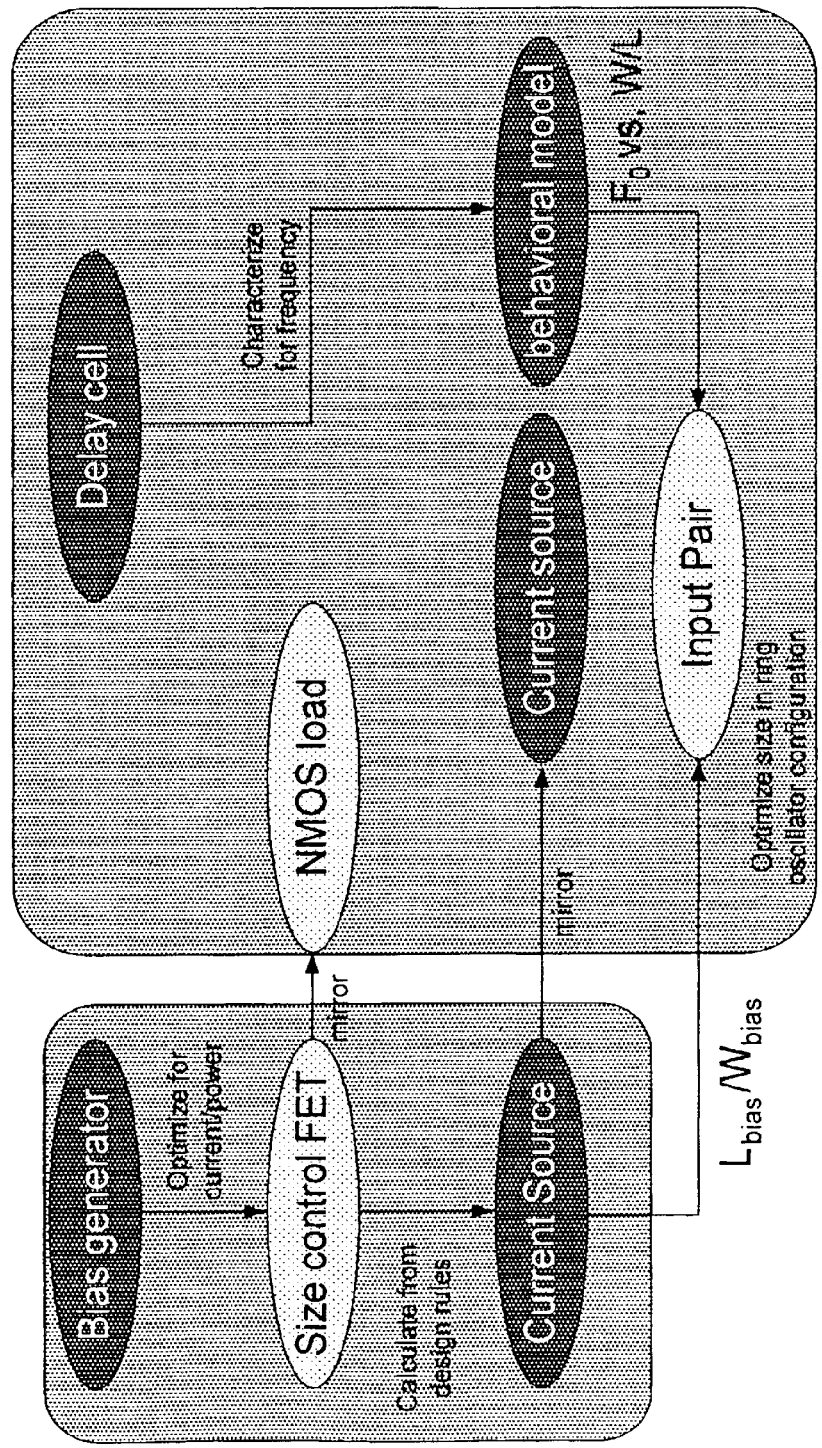
FIG. 11 illustrates the execution of a second step in the synthesis plan.

In step 2, note FIG. 11, the sizes of the control transistor have been copied and that becomes the load and then the size of the transistors developed are referred to as the input pair by analyzing, optimizing the behavioral model.

The current source 910 is handled as a clean-up step at the end. It's hasn't been skipped, we're just saving if for the end. It says "calculate from a design rule" so an optimization doesn't have to be run. The input pair 950 is the two (delay ring) transistors 360 and 370 of FIG. 6.

Figure 12:
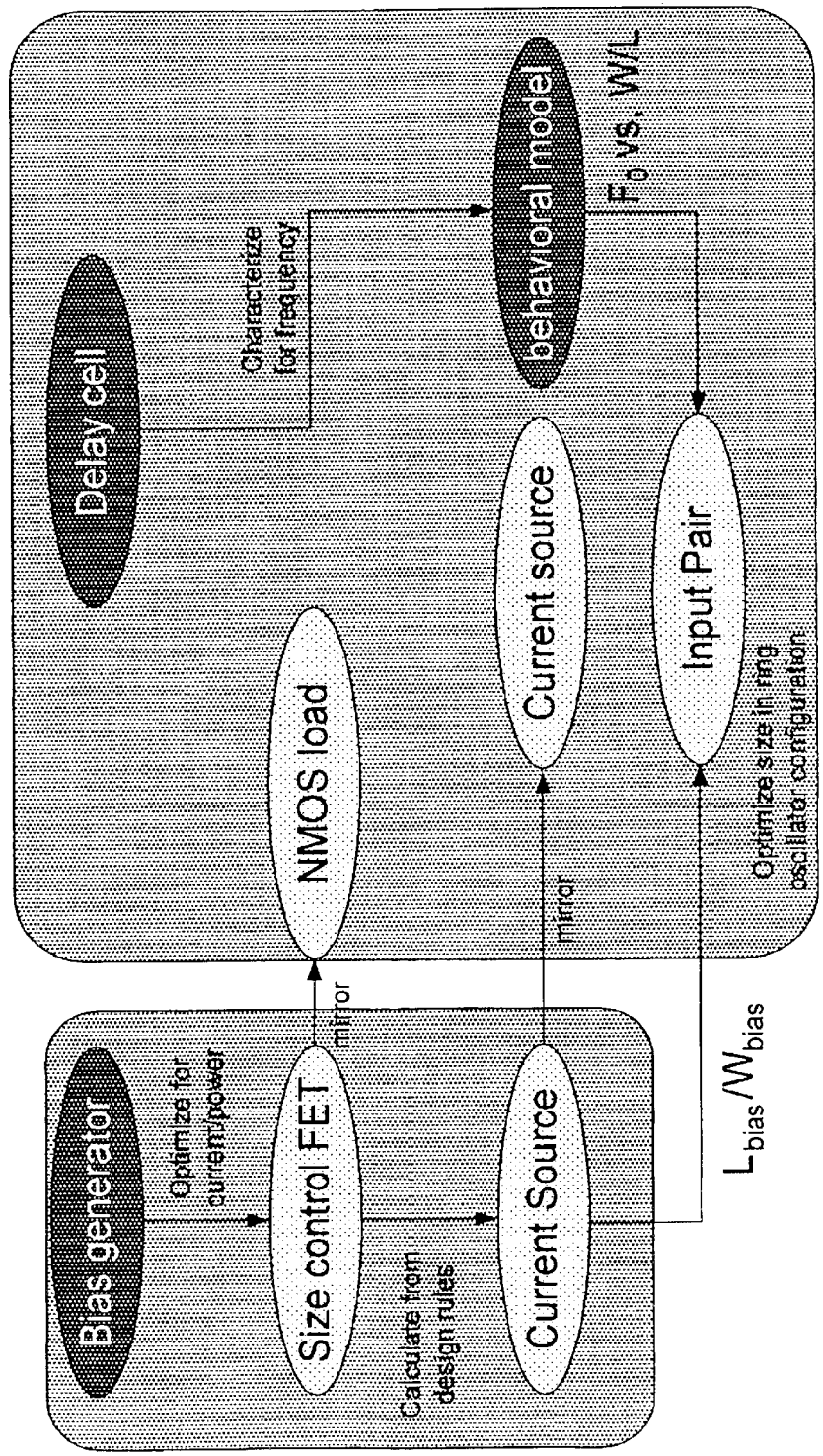
FIG. 12 illustrates the execution of finishing steps in the synthesis plan.

For the finish steps, note FIGS. 12 and 13, all the sizes are available which are then plugged back into the circuit, and the performance can be verified by simulation (using SPICE, for example). If the optimization models were accurate, then that should just be one simple verification step without any iteration. Because it was used to develop the model to begin with but computation steps in between are saved.

So, to the degree that the models built are accurate, then the verification step goes very quickly: The objective is to plug all the dimensions into a circuit because that's what gets used to actually build the chip. The designer needs to know what those dimensions are. That's what gets laid out.

Design synthesis relies heavily on running circuit optimization and the traditional methods for running circuit optimization are very inefficient, and so we could try and be expert mathematicians and make better optimization algorithms, but if we always keep going back to simulation models to do it, we really we won't make very much headway. The synthesis system because allows us to break through and do optimization much, much faster than it was ever done before. An expert circuit designer that knows how to develop these circuits on his own would build a plan, that is basically a program, like the flow/bubble diagrams in FIGS. 9–12, that can get executed by software automatically, which would be called a synthesis plan. It's basically a program for how to build a certain type of circuit. The synthesis plan would become part of a library.

The need for synthesis plans is by people who don't know how to build those types of circuits. In the present invention, with a design plan and a library, for instance, the voltage controlled oscillator of FIG. 3, if that's what somebody needed to put on their chip, rather than have somebody go off and sit down and design it, they would just execute the corresponding plan from the library. The idea is then that the design would be built for them so they don't have to have expert knowledge of how one would sit down and construct a voltage controlled oscillator, because somebody has already put that into a program that can be executed.

A user who might need a 100 MHz oscillator, or a 200 MHz oscillator would execute the same plan with a different performance spec for MHz. Every user might have a different requirement, depending on what his performance specifications are. Then, the synthesis engine would go step by step through the bubble diagram.

Each plan would look different depending on the circuit, depending on types of models that were constructed for the plan. What the plan does is take the specification from the user and convert it into the optimization goals that are used for calculations. It's a reverse of the process that the designer went through. The designer sat down and developed a circuit to build the models and now the user sits down and uses the models to build the circuit. So all the knowledge about the circuit is encapsulated in the models and the plan.

Each plan would come along with its own set of models that describe the characteristics of a circuit. It could be a polynomial or it could be some other type of mathematical expression, or it could just simply be a table, a spreadsheet for example.

The plan identifies which models need to be used at each step in the process, and then calculates the A0–A3's (see equation 1, for instance), when the model is a polynomial equation. In the case of a polynomial model, an algorithm that does curve fitting is utilized to fit the polynomial expression to the curve, a least squares fitting operation, for example. If the polynomial isn't used, a table could be used as the model, and interpolation between points would determine valves between the points of the table.

There are two sides to the MSS system. There's the first side for how the models get built. When you look at that whole system, that's the plan developer, or author. On the second side, there is the user, possibly a novice user that executes the plan developed by the plan author.

The author chooses between a number of different options for how he models his circuits so he has to choose, and he would probably try different ones out to see how well they worked. But once the author decides on a set of models, then the user using the plan just never sees it, the user just runs it (providing selected inputs such as performance specs, as described above).

When the user selects a plan, he's really selecting a predetermined script, or selecting a circuit and the variables in the circuit are what's identified in the polynomial or model. They are variables and if we were only designing a circuit to achieve one specification for performance, then it wouldn't be very useful. But the idea here is that you could design a circuit that meets a number of different specifications and it's up to the user to say what it is he wants to do with it. The program will figure out what the circuit should look like to do that. The present invention cuts out many simulations that you would have to do otherwise if you hadn't converted the information to a behavioral model. The models describe what it does if you sat down and measured it. So that's an example of what those curves are.(see FIG. 8, for example). They hide all the detail and make it a lot easier to figure out.

The present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/ specialized computer or microprocessor are software modules for implementing the teachings of the present invention, including, but not limited to, preparation and storage of plans, calculation of curves, simulation of circuits, collection of data points of circuit behavior, curve fitting, table building, interpolation, characterization, parameterization, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

Industrial Applicability

Accordingly, the present invention provides for synthesis of electronic circuits in advantageous ways.

Other features, aspects and objects of the invention can be obtained from a review of the figures and the claims.

It is to be understood that other embodiments of the invention can be developed and fall within the spirit and scope of the invention and claims.

I claim:

1. A method of making a synthesis plan for use in mixed signal circuit synthesis, comprising the steps of:

developing a mixed signal synthesis library, said mixed signal synthesis library including simulation models specified in a mixed signal synthesis language that represent digital and analog library functions parameterized to a users performance specifications, characteristic functions of design parameters, test harnesses, and netlists of mixed-signal functions parameterized for sizing to achieve a user's performance specifications; and developing a mixed signal synthesis plan for use with said mixed signal synthesis library, comprising the substeps of determining a circuit comprising at least one set of circuit elements, identifying a set of parameters for construction of said circuit elements, simulating operation of said circuit at a set of points, each point defined by varying at least one of said parameters, consolidating results from the simulation operation, and storing the consolidated results of said simulation in a behavioral model of said plan;

wherein the mixed signal synthesis plan can be subsequently executed to invoke a synthesis toolset upon the library in a particular sequence to synthesize a circuit.

2. The method according to claim 1, wherein said step of consolidating comprises the step of placing the results of said simulation in a tabular form that correlates each of said set of points to a corresponding result of said simulation.

3. The method according to claim 2, wherein said circuit elements comprise at least one analog component.

4. The method according to claim 1, wherein said step of storing comprises the steps of:

fitting a polynomial equation to results corresponding to at least two of said set of points; and storing the polynomial equation in a behavioral model of said plan.

5. The method according to claim 3, wherein said circuit elements comprise at least one analog component.

6. The method according to claim 1, wherein said circuit elements comprise at least one analog component.

7. A method of mixed signal circuit synthesis, comprising the steps of:

accessing a mixed signal synthesis library, said mixed signal synthesis library including simulation models specified in a mixed signal synthesis language that represent digital and analog library functions parameterized to a users performance specifications, characteristic functions of design parameters, test harnesses, and netlists of mixed-signal functions parameterized for sizing to achieve a user's performance specifications;

creating one or more plans for use in circuit synthesis, each plan being created by determining a circuit comprising at least one set of circuit elements, identifying a set of parameters for construction of said circuit elements, simulating operation of said circuit at a set of points, each point defined by varying at least one of said parameters, consolidating results from the simulation operation, and storing the consolidated results of said simulation in a behavioral model of said plan; selecting a plan for a circuit to be designed;

providing the selected plan and a set of performance requirements to a synthesis engine;

executing the plan to invoke a mixed signal synthesis toolset upon the mixed signal synthesis library in a particular sequence to synthesize a circuit; and retrieving results of the executed plan.

8. The method according to claim 7, wherein said results comprise at least one of a sized netlist, a datasheet, and a simulation script for verification of the circuit designed.

9. A method of behavioral circuit design optimization, comprising the steps of:

accessing a mixed signal synthesis library, said mixed signal synthesis library including simulation models specified in a mixed signal synthesis language that represent digital and analog library functions parameterized to a users performance specifications, characteristic functions of design parameters, test harnesses, and netlists of mixed-signal functions parameterized for sizing to achieve a user's performance specifications;

determining a circuit comprising at least one set of circuit elements;

identifying a set of parameters for construction of said circuit elements;

simulating operation of said circuit at a set of points, each point defined by varying at least one of said parameters;

fitting a polynomial curve to a result of the circuit simulation at each of said set of points; and selecting a set of said circuit parameters for an optimized circuit based on said polynomial curve.

10. The method according to claim 9, wherein:

said step of simulating comprises the steps of:

setting each of a subset of said parameters to a fixed value;

setting at least one remaining parameter of said set of parameters;

simulating operation of said circuit to produce a result;

varying said at least one remaining parameter of said set of parameters; and repeating said steps of varying and simulating for a predetermined number of iterations.

11. The method according to claim 9, further comprising the steps of:

repeating said steps of simulating and fitting to produce plural data point sets of simulation results; and wherein said step of selecting comprises the step of selecting an optimized circuit solution from the plural data point sets.

12. A mixed signal synthesizer, comprising:

a synthesis engine configured to determine an optimized circuit using mixed signal synthesis and produce a sized netlist based on a plan having a circuit design and parameters for optimizing the circuit;

a mixed signal synthesis library, said mixed signal synthesis library including simulation models specified in a mixed signal synthesis language that represent digital and analog library functions parameterized to a users performance specifications, characteristic functions of design parameters, test harnesses, and netlists of mixed-signal functions parameterized for sizing to achieve a user's performance specifications;

a synthesis plan library having a set of synthesis plans for at least one circuit, each synthesis plan having a circuit design and a set of parameterized values regarding any of physical characteristics and values of circuit elements, said synthesis plan being created by determining a circuit comprising at least one set of circuit elements, identifying a set of parameters for construction of said circuit elements, simulating operation of said circuit at a set of points, each point defined by varying at least one of said parameters, consolidating results from the simulation operation, and, storing the consolidated results of said simulation in a behavioral model of said plan; and a user interface configured to allow a user to select a synthesis plan from the library and input the plan and a set of at least one performance characteristic to said synthesis engine, for use by said synthesis engine in synthesizing a circuit.

13. The mixed signal synthesizer according to claim 12, wherein each synthesis plan includes at least one of a non-sized netlist, a topology, a synthesis model, a test script, a test harness, a cell definition, a cell model, a starting point table, and a characterization plan for said at least one circuit.

14. The mixed signal synthesizer according to claim 12, further comprising:

a synthesis toolset having tools selectable for use by said synthesis engine.

15. The mixed signal synthesizer according to claim 14, wherein said tools comprise at least one of an optimizer, a simulator, a characterizer, and a parasitic calculator.

16. A system for mixed signal circuit synthesis comprising:

a user interface for designing a circuit, wherein said circuit comprises a plurality of circuit elements;

a simulator that simulates the operation of said circuit at a set of points, each of said'set of points defined by varying at least one of a plurality of design parameters associated with said circuit elements;

a mixed signal synthesis library, said mixed signal synthesis library including simulation models specified in a mixed signal synthesis language that represent digital and analog library functions parameterized to a users performance specifications, characteristic functions of design parameters, test harnesses, and netlists of mixed-signal functions parameterized for sizing to achieve a user's performance specifications;

a plurality of synthesis plans that store the consolidated results of said simulations in behavioral models; and a user interface that allows a user to select and use any of said synthesis plans with said mixed signal synthesis library for mixed signal circuit synthesis.

17. The system according to claim 16, wherein said consolidated results include the results of said simulation stored in a tabular form that correlates each of said set of points to a corresponding result of said simulation.

18. The system according to claim 16, wherein said plan includes a polynomial equation fitted to results corresponding to at least two of said set of points; and the polynomial equation in a behavioral model of said plan.

19. The system according to claim 16, wherein said circuit elements comprise at least one analog component.

20. A method for mixed signal circuit synthesis comprising the steps of:

providing a mixed signal synthesis library, said mixed signal synthesis library including simulation models specified in a mixed signal synthesis language that represent digital and analog library functions parameterized to a users performance specifications, characteristic functions of design parameters, test harnesses, and netlists of mixed-signal functions parameterized for sizing to achieve a user's performance specifications;

allowing a user to construct a circuit comprising at least one set of circuit elements;

identifying a set of parameters for construction of said circuit elements;

simulating operation of said circuit at a set of points, each point defined by varying at least one of said parameters;

consolidating the results from the simulation operation;

storing the consolidated results of said simulation in a behavioral model of a synthesis plan; and selecting and using said synthesis plan with said mixed signal synthesis library for synthesis of circuits.

21. The method according to claim 20, wherein said step of consolidating comprises the step of placing the results of said simulation in a tabular form that correlates each of said set of points to a corresponding result of said simulation.

22. The method according to claim 20, wherein said step of storing comprises the steps of: fitting a polynomial equation to results corresponding to at least two of said set of points; and, storing the polynomial equation in a behavioral model of said plan.

23. The method according to claim 20, wherein said circuit elements comprise at least one analog component.

* * * * *